United States Patent
Takada et al.

(10) Patent No.: US 8,709,904 B2
(45) Date of Patent: Apr. 29, 2014

(54) METHOD FOR PRODUCING SEMICONDUCTOR SUBSTRATE, SEMICONDUCTOR SUBSTRATE, METHOD FOR MANUFACTURING ELECTRONIC DEVICE, AND REACTION APPARATUS

(75) Inventors: Tomoyuki Takada, Tsukuba (JP); Masahiko Hata, Tsuchiura (JP); Hisashi Yamada, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 64 days.

(21) Appl. No.: 13/131,523

(22) PCT Filed: Nov. 26, 2009

(86) PCT No.: PCT/JP2009/006411
§ 371 (c)(1),
(2), (4) Date: May 26, 2011

(87) PCT Pub. No.: WO2010/061619
PCT Pub. Date: Jun. 3, 2010

(65) Prior Publication Data
US 2011/0227042 A1 Sep. 22, 2011

(30) Foreign Application Priority Data
Nov. 28, 2008 (JP) .................................. 2008-305564

(51) Int. Cl.
*H01L 21/331* (2006.01)
*H01L 21/336* (2006.01)
*H01L 21/46* (2006.01)
*H01L 21/78* (2006.01)
*H01L 21/26* (2006.01)

(52) U.S. Cl.
USPC ............ 438/378; 438/308; 438/463; 438/795

(58) Field of Classification Search
USPC ............ 257/19; 438/149, 151, 152–154, 164, 438/795, 162, 163, 486, 487, 488, 478, 479, 438/378, 463, 535, 308
See application file for complete search history.

(56) References Cited

U.S. PATENT DOCUMENTS

| 4,614,564 A | 9/1986 | Sheldon et al. |
| 7,098,111 B2 | 8/2006 | Shima |

(Continued)

FOREIGN PATENT DOCUMENTS

| CN | 1799136 A | 7/2006 |
| JP | 61-135115 | 6/1986 |

(Continued)

OTHER PUBLICATIONS

International Preliminary Report on Patentability dated Jul. 5, 2011 in international application PCT/JP2009/006411.

(Continued)

*Primary Examiner* — Chuong A. Luu
(74) *Attorney, Agent, or Firm* — Sughrue Mion, PLLC

(57) ABSTRACT

There is provided a method of producing a semiconductor wafer by thermally processing a base wafer having a portion to be thermally processed that is to be thermally processed. The method comprises a step of providing, on the base wafer, a portion to be heated that generates heat through absorption of an electromagnetic wave and selectively heats the portion to be thermally processed, a step of applying an electromagnetic wave to the base wafer, and a step of lowering the lattice defect density of the portion to be thermally processed, by means of the heat generated by the portion to be heated through the absorption of the electromagnetic wave.

21 Claims, 17 Drawing Sheets

(56) References Cited

U.S. PATENT DOCUMENTS

| | | |
|---|---|---|
| 2004/0238885 A1 | 12/2004 | Bedell et al. |
| 2005/0132952 A1 | 6/2005 | Ward et al. |
| 2010/0308376 A1 | 12/2010 | Takada et al. |
| 2011/0006343 A1 | 1/2011 | Hata et al. |
| 2011/0006399 A1 | 1/2011 | Takada et al. |
| 2011/0012175 A1 | 1/2011 | Takada et al. |
| 2011/0018030 A1 | 1/2011 | Takada et al. |
| 2011/0037099 A1 | 2/2011 | Takada et al. |
| 2011/0180903 A1 | 7/2011 | Hata |
| 2011/0180949 A1 | 7/2011 | Bierdel et al. |
| 2011/0186911 A1 | 8/2011 | Hata |
| 2011/0227199 A1* | 9/2011 | Hata et al. ............... 257/616 |
| 2011/0266595 A1 | 11/2011 | Hata |

FOREIGN PATENT DOCUMENTS

| | | | |
|---|---|---|---|
| JP | 63-158832 | * | 7/1988 |
| JP | 63-158832 A | | 7/1988 |
| JP | 63-265424 | * | 11/1988 |
| JP | 63-265424 A | | 11/1988 |
| JP | 64-39723 A | | 2/1989 |
| JP | 8-17755 A | | 1/1996 |
| JP | 08-203833 A | | 8/1996 |
| JP | 8-316152 A | | 11/1996 |
| JP | 11-345812 A | | 12/1999 |
| JP | 2001-053004 A | | 2/2001 |
| JP | 2004-281869 A | | 10/2004 |
| JP | 2005-101196 A | | 4/2005 |
| JP | 2005-236265 | | 9/2005 |
| JP | 2008-021827 A | | 1/2008 |
| WO | 2006/098513 A1 | | 9/2006 |
| WO | 2006/125040 A2 | | 11/2006 |

OTHER PUBLICATIONS

Luan, Hsin-Chiao, et al., "High-quality Ge epilayers on Si with low threading-dislocation densities," Applied Physics Letters, Nov. 8, 1999, pp. 2909-2911, vol. 75, No. 19.

Office Action dated Jan. 7, 2013 from the People's Republic of China Patent Office in a counterpart Chinese Application No. 200980147545.2.

Oh H. J. et al., "Integration of GaAs epitaxial layer to Si-based substrate using Ge condensation and low-temperature migration enhanced epitaxy techniques", Journal of Applied Physics, 2007, vol. 102, No. 5, pp. 054306-1-054306-6.

Japanese Office Action mailed on Feb. 4, 2014 from the Japanese Patent Office in Japanese Application No. 2009-269919.

* cited by examiner

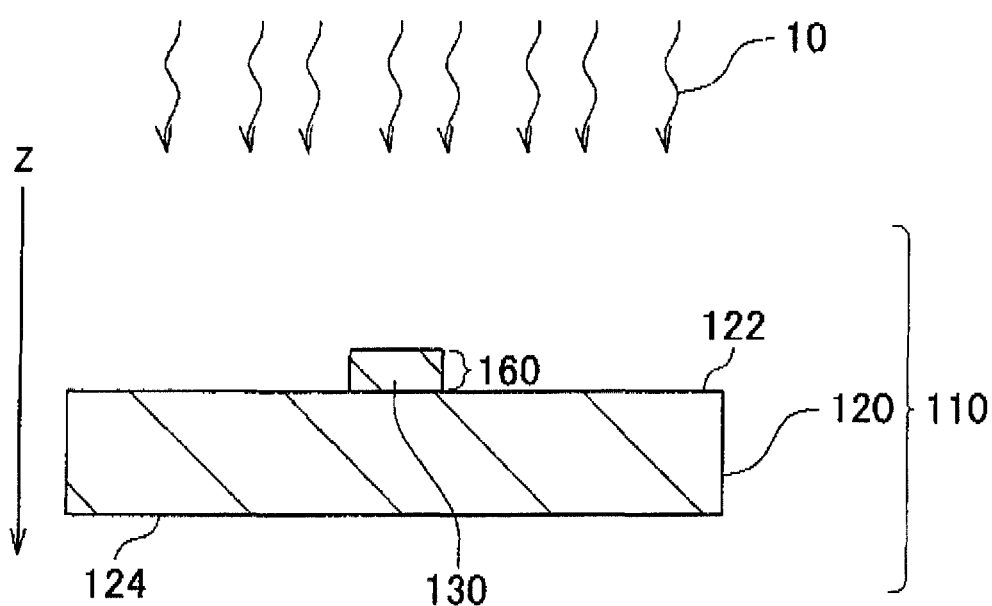
F I G . 1B

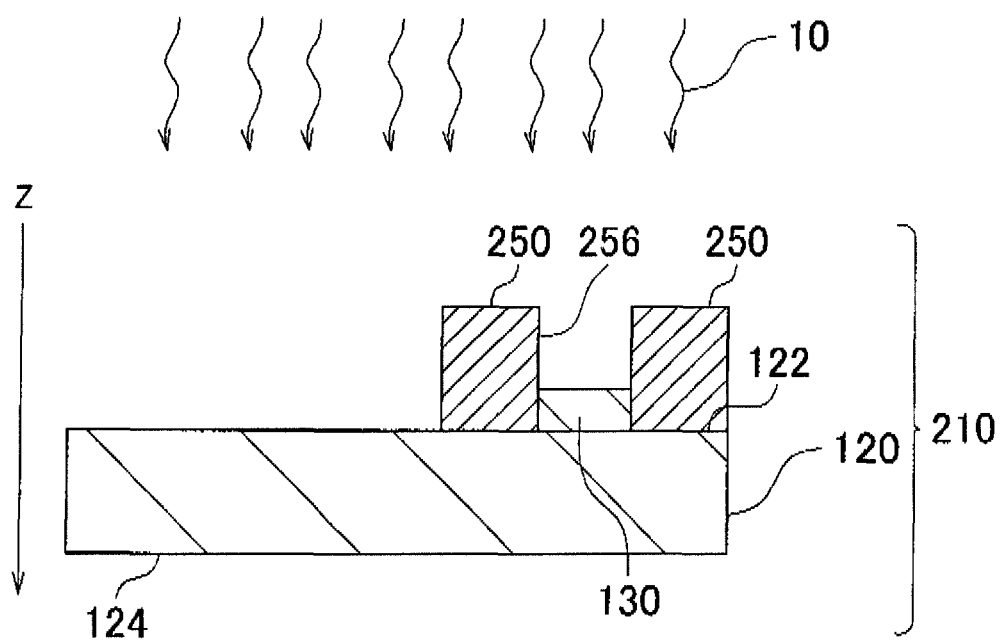
F I G . 2

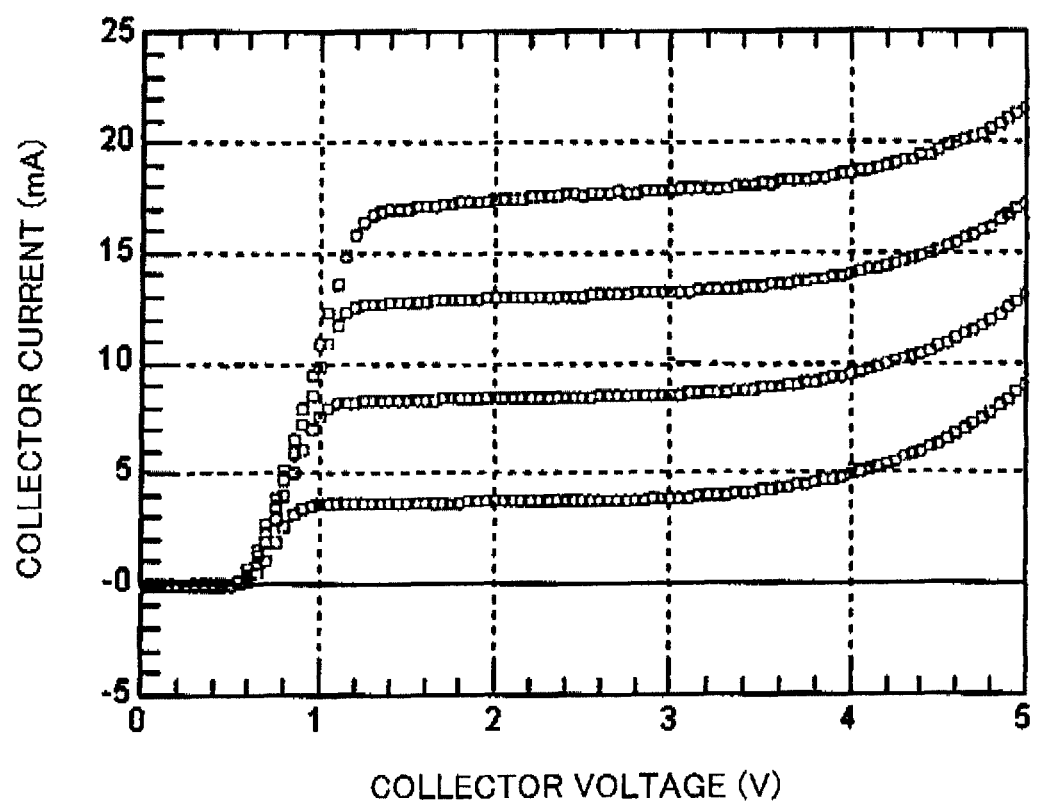
F I G. 17

METHOD FOR PRODUCING SEMICONDUCTOR SUBSTRATE, SEMICONDUCTOR SUBSTRATE, METHOD FOR MANUFACTURING ELECTRONIC DEVICE, AND REACTION APPARATUS

TECHNICAL FIELD

The present invention relates to a method of producing a semiconductor wafer, a semiconductor wafer, a method of producing an electronic device, and a reaction apparatus.

BACKGROUND ART

In recent years, a variety of highly advanced electronic devices using a compound semiconductor such as GaAs in an active region have been developed. Crystallinity of the compound semiconductor has a great impact on the performance or the electronic device, and so it is required to form a compound semiconductor having superior crystallinity. For example, when an electronic device using a GaAs-based compound semiconductor in an active region is manufactured, a crystalline thin film is epitaxially grown on a GaAs wafer, or a Ge wafer that can have a lattice match with the compound semiconductor to achieve a crystalline thin film having high quality.

For example, Patent Document 1 discloses a compound semiconductor epitaxial wafer and a compound semiconductor device in which a GaAs wafer, an AlGaAs buffer layer, a GaAs channel layer, and a GaAs contact layer are arranged in the stated order. The crystalline thin films made of the compound semiconductors are formed by vapor-phase epitaxy.

Non-Patent Document 1 discloses that the crystallinity of a Ge crystalline thin film having been epitaxially grown on a Si wafer (base wafer) can be improved by performing cycle thermal annealing on the Ge crystalline thin film. For example, a Ge crystalline thin film having an average dislocation density or $2.3 \times 10^6$ cm$^{-2}$ can be yielded by performing thermal annealing at the temperature of 800° C. to 900° C. Here, the average dislocation density is introduced as an exemplary lattice defect density.

Patent Document 1: JP 11-345812 A
Non-Patent Document 1: Hsin-Chiao Luan et al., "High-quality Ge epilayers on Si with low threading-dislocation densities," APPLIED PHYSICS LETTERS, VOLUME 75, NUMBER 19, 8 Nov. 1999

SUMMARY OF THE INVENTION

Problem to be Solved by the Invention

Crystallinity of a channel layer can be improved by forming a GaAs-based compound semiconductor by crystal growth on a GaAs wafer or a Ge wafer. This, however, increases the manufacturing cost of the electronic device since the GaAs wafer, the Ge wafer and the like are more expensive than a Si wafer. In addition, since the GaAs wafer and the Ge wafer do not have sufficiently high heat dissipation characteristics, limitations are imposed on the density of the devices to be formed or a working temperature of the devices. For the above-discussed reasons are desired a semiconductor wafer and an electronic device that have a good-quality compound semiconductor crystalline thin film in which a wafer being inexpensive and having superior heat dissipation characteristics such as a Si wafer has been used.

The crystallinity of a Ge thin film having been formed on a Si wafer can be improved by annealing the Ge thin film at the temperature of 800° C. to 900° C. The annealing, however, cannot be performed at the temperature of 800° C. to 900° C. when the wafer has a low-thermal-resistance portion. In other words, when applying such a method to the production of the electronic device, the electronic device production process is significantly restricted. In addition, a thermal design of the electronic device will be very complex.

Means for Solving Problem

For a solution to the above-mentioned problems, according to the first aspect related to the present invention, provided is one exemplary method of producing a semiconductor wafer by thermally processing a base wafer having a portion to be thermally processed that is to be thermally processed. The method of producing a semiconductor wafer includes a step of providing, on the base wafer, a portion to be heated that generates heat through the absorption of an electromagnetic wave and selectively heats the portion to be thermally processed, a step of applying an electromagnetic wave to the base wafer, and a step of lowering the lattice defect density of the portion to be thermally processed, by means of the heat generated by the portion to be heated through the absorption of the electromagnetic wave. For example, the base wafer is an SOI wafer or a Si wafer, and the absorption coefficient of the portion to be thermally processed for the electromagnetic wave is higher than the absorption coefficient of Si included in the base wafer for the electromagnetic wave.

In the step of providing a portion to be heated on the base wafer, for example, provided is a portion to be heated having such an absorptive layer that the ratio of the amount of heat to be generated to the amount of the energy of the electromagnetic wave to be applied is higher than the ratio of the amount of heat to be generated to the amount of the energy of the electromagnetic wave applied when the electromagnetic wave is applied to the portion to be thermally processed, and the absorptive layer has been provided above the portion to be thermally processed. In the step of lowering, the lattice defect density of the portion to be thermally processed is lowered by means of the heat generated by the absorptive layer through the absorption of the electromagnetic wave. The production method, in the step of lowering the lattice defects density, lowers the lattice defect density in the Si$_x$Ge$_{1-x}$ crystal ($0 \leq x < 1$) to, for example, $10^5$ cm$^{-2}$ or lower.

The method of producing a semiconductor wafer can further include a step of forming an electronic element in the base wafer. For example, the ratio of the amount of the heat to be generated to the amount of the energy of the electromagnetic wave in the absorptive layer is higher than the ratio of the amount of the heat to be generated to the amount of the energy of the electromagnetic wave when the electromagnetic wave is applied to at least a part of the electronic element. The absorption coefficient of the absorptive layer for the electromagnetic wave can be higher than the absorption coefficient in at least a part of the electronic element. The production method can further include a step of forming, above the electronic element, a protective layer protecting the electronic element from the electromagnetic wave. In the step of applying an electromagnetic wave to the base wafer, the electromagnetic wave such that the absorption coefficient in the portion to be thermally processed is higher than the absorption coefficient in a region on an electronic device manufactured by dicing the base wafer, the region being other than the portion to be thermally processed, can be applied to the base wafer.

The method of producing a semiconductor wafer can further include a step of growing a precursor of a Si$_x$Ge$_{1-x}$ crystal ($0 \leq x < 1$) as the portion to be thermally processed into a crystal on the base wafer. The method of producing a semiconductor wafer can further include, after the step of lowering the lattice defect density, a step of forming, by crystal growth, a group III-V compound semiconductor that has a lattice match or a pseudo lattice match with the $Si_xGe_{1-x}$ crystal ($0 \leq x < 1$). Furthermore, the method of producing a semiconductor wafer can include, after the step of lowering the lattice defect density without exposing the base wafer to air after the step of growing a precursor of a $Si_xGe_{1-x}$ crystal into a crystal. According to the method of producing a semiconductor wafer, the step of growing a precursor of a $Si_xSi_{1-x}$ crystal into a crystal can be performed in a same reaction chamber as the step of lowering the lattice defect density.

According to the method of producing a semiconductor wafer, for example, the electromagnetic wave is, in the step of forming a group III-V compound semiconductor by crystal growth, applied again to the base wafer by using the light source that applied the electromagnetic wave in the step of lowering the lattice defect density. According to the production method, in the step of lowering the lattice defect density, the electromagnetic wave can be uniformly applied to the entire base wafer. According to the production method, in the step of lowering the lattice defect density, the electromagnetic wave that has been pulsed can be applied to the base wafer multiple times. According to the method of producing a semiconductor wafer, the electromagnetic wave can be applied from a side of the main plane of the base wafer while heating is performed from a side of the back plane being opposite to the main plane in which the portion to be thermally processed has been provided.

The method of producing a semiconductor wafer can include a step of forming, above the electronic element, an inhibition layer inhibiting a precursor of the portion to be thermally processed from growing into a crystal on the base wafer, a step of forming, in the inhibition layer, an opening that penetrates the inhibition layer to the base wafer, a step of forming, as the portion to be thermally processed, a seed crystal within the opening, a step of forming the absorptive layer for heating the seed crystal, and a step of annealing the seed crystal by applying the electromagnetic wave, and the inhibition layer can protect the electronic element from the electromagnetic wave. The production method can further include, after the step of annealing, a step of forming, by crystal growth, a compound semiconductor that has a lattice match or a pseudo lattice match with the seed crystal. The seed crystal is, for example, a $Si_xGe_{1-x}$ crystal ($0 \leq x < 1$), and the compound semiconductor is a group III-V compound semiconductor. At least a part of the inhibition layer can be positioned between the absorptive layer and the seed crystal.

According to the second aspect related to the present invention, provided is one exemplary semiconductor wafer including a base wafer, a $Si_xGe_{1-x}$ crystal ($0 \leq x < 1$) disposed on the base wafer, and an absorptive layer that selectively heats the $Si_xGe_{1-x}$ crystal by heat generated by the absorptive layer through the absorption of an electromagnetic wave having been applied to the base wafer, and the $Si_xGe_{1-x}$ crystal has a lattice defect density of $10^5$ cm$^{-2}$ or lower. The semiconductor wafer can further include an electronic element formed on the base wafer, and an inhibition layer that has been formed on the electronic element and inhibits a precursor of the $Si_xGe_{1-x}$ crystal from growing into a crystal and protects the electronic element from the electromagnetic wave, and the $Si_xGe_{1-x}$ crystal can be disposed within an opening that penetrates the inhibition layer to the base wafer.

According to the third aspect related to the present invention, provided is one exemplary method of producing an electronic device having a first electronic element and a second electronic element. The method of producing an electronic device includes a step of forming the first electronic element on a base wafer, a step of forming a $Si_xGe_{1-x}$ crystal ($0 \leq x < 1$) on the base wafer, a step of forming an absorptive layer that selectively heats the $Si_xGe_{1-x}$ crystal, a step of applying an electromagnetic wave to the base wafer, a step of lowering the lattice defect density of the $Si_xGe_{1-x}$ crystal by means of heat generated by the absorptive layer through the absorption of the electromagnetic wave, a step of forming, by crystal growth, a group III-V compound semiconductor that has a lattice match or a pseudo lattice match with the $Si_xGe_{1-x}$ crystal, and a step of forming, on the compound semiconductor, the second electronic element that is electrically coupled to the first electronic element.

According to the production method, in the step of forming an absorptive layer, for example, is formed above the $Si_xGe_{1-x}$ crystal the absorptive layer such that the ratio of the amount of the heat to be generated to the amount of the energy of the electromagnetic wave to be applied is higher than the ratio of the amount of the heat to be generated to the amount of the energy of the electromagnetic wave when the electromagnetic wave is applied to the $Si_xGe_{1-x}$ crystal. According to the production method, in the step of forming an absorptive layer, the absorptive layer such that the ratio of the amount of the heat to be generated to the amount of the energy of the electromagnetic wave to be applied is higher than the ratio of the amount of the heat to be generated to the amount of the energy of the electromagnetic wave when the electromagnetic wave is applied to the first electronic element, can be formed above the $Si_xGe_{1-x}$ crystal.

According to the fourth aspect related to the present invention, provided is one exemplary method of producing an electronic device having a first electronic element and a second electronic element. The method of producing an electronic device includes a step of forming the first electronic element on a base wafer selected among an SOI wafer and a Si wafer, a step of forming a $Si_xGe_{1-x}$ crystal ($0 \leq x < 1$) on the base wafer, a step of applying, to the base wafer, an electromagnetic wave such that the absorption coefficient in the $Si_xGe_{1-x}$ crystal is higher than the absorption coefficient of Si included in the base wafer, a step of lowering the lattice defect density of the $Si_xGe_{1-x}$ crystal by means of heat generated by the $Si_xGe_{1-x}$ crystal through the absorption of the electromagnetic wave having been applied, a step of forming, by crystal growth, a group III-V compound semiconductor that has a lattice match or a pseudo lattice match with the $Si_xGe_{1-x}$ crystal, and a step of forming the second electronic element on the compound semiconductor.

The production method can further include a step of forming, so as to cover at least the first electronic element, an inhibition layer that inhibits a precursor of the $Si_xGe_{1-x}$ crystal from growing into a crystal and protects the first electronic element from the electromagnetic wave, a step of forming, in the inhibition layer, an opening that penetrates the inhibition layer to the base wafer in a region of the inhibition layer, the region being other than a region covering the first electronic element, and a step of forming the $Si_xGe_{1-x}$ crystal within the opening by growing a precursor of the $Si_xGe_{1-x}$ crystal into a crystal.

For example, the first electronic element is an electronic element included in at least one circuit among a driving circuit for the second electronic element, a correction circuit for improving linearity of input and output characteristics of the second electronic element, and a protection circuit for an input stage of the second electronic element, and the second electronic element is an electronic element included in at least one device among an analog electronic device, a light emitting device, and a light receiving device.

According to the fifth aspect related to the present invention, provided is one exemplary reaction apparatus including a reaction chamber that holds therein a base wafer having a portion to be heated that selectively heats a portion to be thermally processed that is to be thermally processed, an applying section that applies an electromagnetic wave toward the main plane of the base wafer, the main plane having the portion to be heated formed therein, a heating section that heats the entire base wafer from a side of the back plane opposite to the main plane, a heating temperature measuring section that measures a temperature of the base wafer, a temperature measuring section that measures a temperature of the portion to be heated, a control section that controls the applying section and the heating section based on a result of the measurement performed by the heating temperature measuring section and a result of the measurement performed by the temperature measuring section. The temperature measuring section measures the temperature of the portion to be heated, for example, based on radiant heat from the portion to be heated. The control section determines, for example, based on the result of the measurement performed by the heating temperature measuring section, an application period during which the applying section applies the electromagnetic wave and a non-application period during which the applying section does not apply the electromagnetic wave.

The reaction apparatus may further include a filter that has been disposed between the base wafer and the applying section and blocks a wavelength component of the electromagnetic wave at which the absorption coefficient in the base wafer is higher than the absorption coefficient in the portion to be heated. The reaction apparatus can further include a gas supply section that supplies a source gas into the reaction chamber, and a compound semiconductor can be formed by crystal growth on the portion to be heated, by reaction of the source gas within the reaction chamber. In the reaction apparatus, for example, a temperature of the source gas and a temperature of a carrier gas that is supplied together with the source gas are lower than a temperature of the base wafer, and the source gas cools the base wafer while the compound semiconductor is formed by crystal growth.

BRIEF DESCRIPTION OF THE DRAWINGS

FIG. 1B schematically illustrates an exemplary cross-section of the semiconductor wafer 110.

FIG. 2 schematically illustrates an exemplary cross-section of a semiconductor wafer 210.

FIG. 17 shows how the collector current of a HBT varies depending on the collector voltage of the HBT.

MODE FOR CARRYING OUT THE INVENTION

Figure 1A:
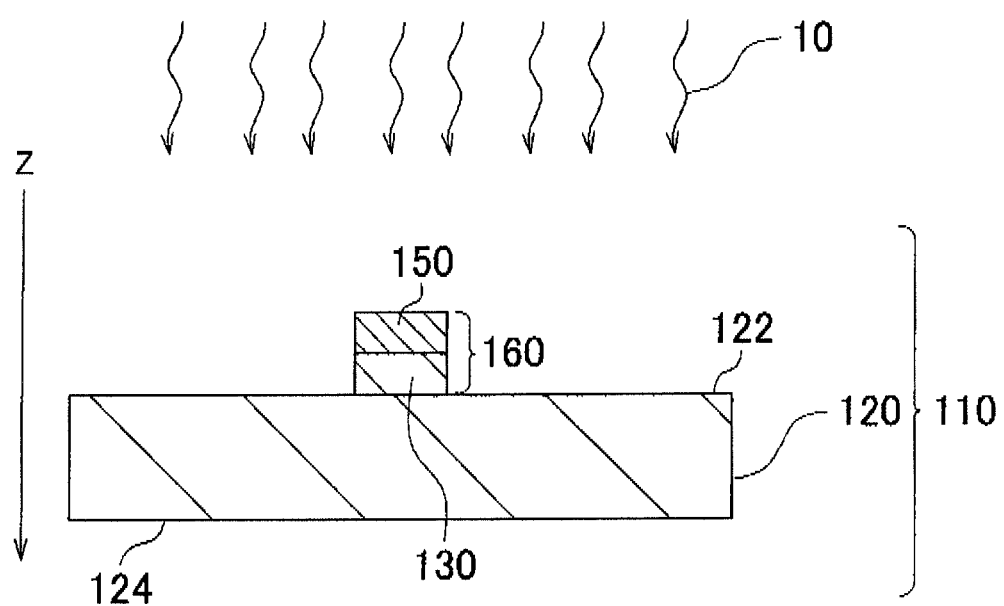
FIG. 1A schematically illustrates an exemplary cross-section of a semiconductor wafer 110.

Some aspects of the invention will now be described based on the embodiments, which do not intend to limit the scope of the present invention, but exemplify the invention. All of the features and the combinations thereof described in the embodiment are not necessarily essential to the invention. The embodiments of the present invention will be hereinafter described with reference to the appended drawings, in which identical or similar components may be designated by identical reference numerals and not be repeatedly described. It should be noted that the drawings are only schematic, and the relation between the thickness and the planar dimension, the ratio and other dimensional features shown in the drawings may not reflect the actual scale. For the purposes of the description, the dimensions or ratios may be partly on different scales among the drawings.

FIG. 1A schematically illustrates an exemplary cross-section of a semiconductor wafer 110. The semiconductor wafer 110 is produced by thermally processing a base wafer 120. The base wafer 120 has a portion to be thermally processed 130 formed thereon. The portion to be thermally processed 130 is to be thermally processed by application of an electromagnetic wave 10. Furthermore, the base wafer 120 has a portion to be heated 160 formed thereon. The portion to be heated 160 is designed to selectively heat the portion to be thermally processed 130. The portion to be heated 160 may include the portion to be thermally processed 130. According to the present example, the portion to be heated 160 includes the portion to be thermally processed 130 and an absorptive layer 150. Here, "selectively heating" means that a particular region on the base wafer 120 may be applied with more heat than the other region.

When the electromagnetic wave 10 is applied to the base wafer 120, the portion to be heated 160 absorbs the electromagnetic wave 10 to generate heat. The heat generated by the portion to be heated 160 selectively heats the portion to be thermally processed 130, as a result of which only the portion to be thermally processed 130 is selectively annealed. Thus, the semiconductor wafer 110 can be produced that has the portion to be thermally processed 130 with a reduced average dislocation density.

The base wafer 120 has a first main plane 122 and a second main plane 124. The base wafer 120 is, for example, any one wafer among a Si wafer, a silicon-on-insulator (SOI) wafer, a Ge wafer, a germanium-on-insulator (GOI) wafer, and a GaAs wafer. The Si wafer may be a single-crystal Si wafer. Alternatively, the base wafer 120 may be a sapphire wafer, a glass wafer, or a resin wafer such as a PET film.

The portion to be thermally processed 130 is, for example, a semiconductor crystal. The portion to be thermally processed 130 is, for example, formed by chemical vapor deposition (hereinafter, may be referred to as CVD), metal organic chemical vapor deposition (may be referred to as MOCVD), molecular beam epitaxy (may be referred to as MBE), or atomic layer deposition (may be referred to as ALD).

The portion to be thermally processed 130 includes, for example, a $Si_xGe_{1-x}$ crystal that is in contact with the first main plane 122 of the base wafer 120. Here, x is a real number satisfying the condition of $0 \leq x < 1$. Due to the difference in lattice constant between the base wafer 120 and the $Si_xGe_{1-x}$ crystal, and other factors, defects such as lattice defects may occur within the $Si_xGe_{1-x}$ crystal. The annealing of the $Si_xGe_{1-x}$ crystal by means of heating causes the defects to move within the $Si_xGe_{1-x}$ crystal, so that the defects are trapped by the boundary or the surfaces of the $Si_xGe_{1-x}$ crystal, an internal gettering sink of the $Si_xGe_{1-x}$ crystal, or the like. As a result, the $Si_xGe_{1-x}$ crystal can have a region with a reduced density of defects represented by threading dislocations that reach the surface of the $Si_xGe_{1-x}$ crystal and thus achieve high quality.

The annealing is preferably performed under a composite atmosphere containing hydrogen and an inert gas. If the annealing is performed within air or an inert gas, pits (holes) may be formed on the surface of the $Si_xGe_{1-x}$ crystal. When the annealing is performed under a composite atmosphere containing hydrogen and an inert gas, the hydrogen concentration is preferably 90% or higher of the composite atmosphere, more preferably 95% or higher. The annealing can be performed with a pressure of approximately 20 kPa or lower.

The absorptive layer 150 is provided on the portion to be thermally processed 130. The absorptive layer 150 absorbs the electromagnetic wave 10 to generate heat. The absorptive layer 150 heats the portion to be thermally processed 130 using the generated heat, to lower the average dislocation density of the portion to be thermally processed 130. The absorptive layer 150 includes, for example, amorphous silicon, a group III-V compound semiconductor, or a $Si_xGe_{1-x}$ crystal ($0 \leq x < 1$).

The absorptive layer 150 generates heat more efficiently than the portion to be thermally processed 130 by application of an electromagnetic wave. Stated differently, the ratio of the amount of the heat to be generated by the absorptive layer 150 to the amount of the energy of the electromagnetic wave 10 to be applied is higher than the ratio of the amount of the heat to be generated to the amount of the energy of the electromagnetic wave 10 applied when the electromagnetic wave 10 is applied to the portion to be thermally processed 130.

Accordingly, when the absorptive layer 150 is provided on the portion to be thermally processed 130, the energy of the electromagnetic wave 10 is more efficiently converted into beat to beat the portion to be thermally processed 130 than when the portion to be heated 160 does not include the absorptive layer 150. In the above-described manner, the portion to be thermally processed 130, which is positioned in the vicinity of the absorptive layer 150, can be selectively heated without raising the temperature or the entire base wafer 120. In other words, the portion to be thermally processed 130 can be selectively heated, in contrast with the region of the base wafer 120 on which the absorptive layer 150 is not provided.

The absorptive layer 150, the portion to be thermally processed 130, and the base wafer 120 are preferably arranged in the stated order in the transmission direction Z of the electromagnetic wave 10. The above arrangement achieves the efficient use of the energy of the applied electromagnetic wave 10. Alternatively, in the transmission direction Z of the electromagnetic wave 10, the portion to be thermally processed 130, the absorptive layer 150, and the base wafer 120 may be arranged in the stated order. Alternatively, the portion to be thermally processed 130 and the absorptive layer 150 may be arranged adjacent to each other on the first main plane 122. Alternatively, the absorptive layer 150 may be arranged so as to cover the portion to be thermally processed 130.

The portion to be thermally processed 130 may constitute a part of the base wafer 120. For example, when a Ge wafer or a GOI wafer is used as the base wafer 120, the portion to be thermally processed 130 is at least a part of the $Si_xGe_{1-x}$ crystal layer ($0 \leq x < 1$) included in the Ge wafer or the GOI wafer. In this case, the base wafer 120 may include a heat retaining portion that surrounds at least a part of the portion to be thermally processed 130. The heat retaining portion is preferably made of a material with a low thermal conductivity. This achieves the efficient use of the energy of the electromagnetic wave 10 applied to the portion to be thermally processed 130. The $Si_xGe_{1-x}$ crystal may be amorphous, polycrystalline, or single-crystalline. The portion to be thermally processed 130 may be a group III-V compound semiconductor, a Si crystal, or amorphous silicon.

The portion to be thermally processed 130 may be a region that is to constitute an impurity region of a semiconductor device. For example, the portion to be thermally processed 130 is an impurity implanted region into which impurities have been introduced by ion implantation or other techniques. In this case, impurities are introduced by ion implantation or other techniques, for example, into at least a part of a region that is to constitute the impurity implanted region. After this, the region is heated to be annealed, so that the crystallinity of the region is restored and the impurities are activated. In this way, the impurity implanted region is formed.

Alternatively, the portion to be thermally processed 130 may be an impurity-diffused region in which impurities have been diffused by a thermal process. In this case, an impurity diffusing source is formed, for example, by coating, CVD or other techniques in at least a part of a region that is to constitute the impurity-diffused region. After this, the region is heated to be annealed. In this way, the impurity-diffused region is formed.

The impurity region is, for example, a well, a source region, or a drain region of a metal-insulator-semiconductor field-effect transistor (MISFET). The MISFET may be a metal-oxide-semiconductor field-effect transistor (MOSFET).

The electromagnetic wave 10 transmits through the semiconductor wafer 110, for example, from the first main plane 122 to the second main plane 124 in the substantially perpendicular direction to the first main plane 122. The transmission direction of the electromagnetic wave 10 is not limited to such.

As used herein, "a substantially perpendicular direction" refers not only to a strictly perpendicular direction but also to directions slightly off the perpendicular direction considering the manufacturing errors of the wafer and the respective components. Referring to the phrase "transmission direction Z,"

the term "transmission" is used in order to identify a particular direction and does not require that the electromagnetic wave 10 actually transmit.

FIG. 1B schematically illustrates another exemplary cross-section of the semiconductor wafer 110. The portion to be heated 160 relating to the present example is different from the portion to be heated 160 shown in FIG. 1A in that the absorptive layer 150 is omitted. According to the present example, the portion to be thermally processed 130 represents the same region as the portion to be heated 160. In this case, the portion to be thermally processed 130 also serves as the absorptive layer 150 shown in FIG. 1A.

When the electromagnetic wave 10 is applied to the base wafer 120, the portion to be thermally processed 130, which is equivalent to the portion to be heated 160, absorbs the electromagnetic wave 10 to generate heat. The heat generated by the portion to be thermally processed 130 selectively heats the portion to be thermally processed 130, as a result of which only the portion to be thermally processed 130 is selectively annealed. Thus, the semiconductor wafer 110 can be produced that has a reduced average dislocation density.

When the base wafer 120 is an SOI wafer or a Si wafer, the electromagnetic wave 10 preferably has a wavelength at which the absorption coefficient of the portion to be thermally processed 130 for the electromagnetic wave 10 is higher than the absorption coefficient of the Si included in the base wafer 120 for the electromagnetic wave 10. The electromagnetic wave 10 may have a wavelength at which the portion to be thermally processed 130 has a higher absorption coefficient than a region, other than the portion to be thermally processed 130, of the electronic device that is fabricated by dicing the base wafer 120. In these cases, for example, the portion to be thermally processed 130 can be selectively heated even though the portion to be heated 160 does not have the absorptive layer 150.

FIG. 2 schematically illustrates an exemplary cross-section of a semiconductor wafer 210. The semiconductor wafer 210 includes the base wafer 120, the portion to be thermally processed 130 and an absorptive layer 250. In the present embodiment, the absorptive layer 250 is in contact with the first main plane 122 of the base wafer 120. The portion to be thermally processed 1.30 is partially surrounded by the absorptive layer 250.

The absorptive layer 250 serves as an inhibition layer that inhibits crystal growth. For example, the absorptive layer 250 inhibits the precursors of the portion to be thermally processed 130 from growing into a crystal. When a compound semiconductor crystal is epitaxially grown using MOCVD, the absorptive layer 250 inhibits the compound semiconductor crystal from epitaxially growing on the surface of the absorptive layer 250.

The absorptive layer 250 is, for example, a silicon oxide layer, an aluminum oxide layer, a silicon nitride layer, a silicon oxynitride layer, a tantalum nitride layer, a titanium nitride layer, or a laminate formed by the above-mentioned layers. For example, the absorptive layer 250 has the thickness of 0.05 µm to 5 µm. The absorptive layer may be an amorphous silicon layer or a germanium layer. The absorptive layer 250 can be formed, for example, by CVD.

The opening 256 penetrates through the absorptive layer 250 in the substantially perpendicular direction to the first main plane 122 to reach the first main plane 122. The opening 256 externally exposes the first main plane 122. The opening 256 is formed, for example, by photolithography such as etching. Within the opening 256, the portion to be thermally processed 130 is formed. For example, when a semiconductor such as a $Si_yGe_{1-y}$ crystal ($0 \leq y \leq 1$) is Formed as the portion to be thermally processed 130 by epitaxial growth, the semiconductor is inhibited from growing on the surface of the absorptive layer 250. As a result, the portion to be thermally processed 130 is selectively grown within the opening 256.

The opening 256 has, for example, an aspect ratio of $(\sqrt{3})/3$ or higher. When a crystal that is thick to some extent is formed within the opening 256 having an aspect ratio of $(\sqrt{3})/3$ or higher, the defects such as lattice defects in the crystal are terminated by the wall of the opening 256. As a result, the surface of the crystal, the surface being externally exposed in the opening 256, already has superior crystallinity on completion of the formation of the crystal. The opening 256 may have an area of 1 mm² or smaller, preferably smaller than 0.25 mm².

As used herein, "an aspect ratio of an opening" is defined as a result of dividing "the depth of the opening" by "the width of the opening." For example, an aspect ratio is defined as the result of dividing the etching depth by the pattern width in "Handbook for Electronics, Information and Communication Engineers, Volume 1," edited by the Institute of Electronics, Information and Communication Engineers, Page 751, 1988, published by Ohmsha. The term "aspect ratio" is used herein to mean a similar meaning to the above.

The depth of the opening is defined as the depth of the opening in the direction in which the thin films are stacked on the wafer. The width of the opening is defined as the width of the opening in the perpendicular direction to the stacking direction. When the opening has a plurality of widths, the smallest width is used to calculate the aspect ratio of the opening. For example, when the opening is shaped as a rectangle when seen in the stacking direction, the length of the short side of the rectangle is used to calculate the aspect ratio.

Subsequently, the electromagnetic wave 10 is applied to the base wafer 120 in a similar manner to the ease where the semiconductor wafer 110 is produced. The wavelength of the electromagnetic wave 10 is selected such that the electromagnetic wave 10 is absorbed by the absorptive layer 250. By selecting the wavelength of the electromagnetic wave 10 in the above-described manner, the electromagnetic wave 10 applied to the base wafer 120 can selectively heat the absorptive layer 250 even if the portion to be thermally processed 130 is unlikely to absorb the electromagnetic wave 10. In this way, the portion to be thermally processed 130, which is positioned in the vicinity of the absorptive layer 250, can be selectively heated without raising the temperature of the entire base wafer 120. In other words, the portion to be thermally processed 130 can be selectively heated, in contrast with the region of the base wafer 120 on which the absorptive layer 250 is not provided.

Figure 3:
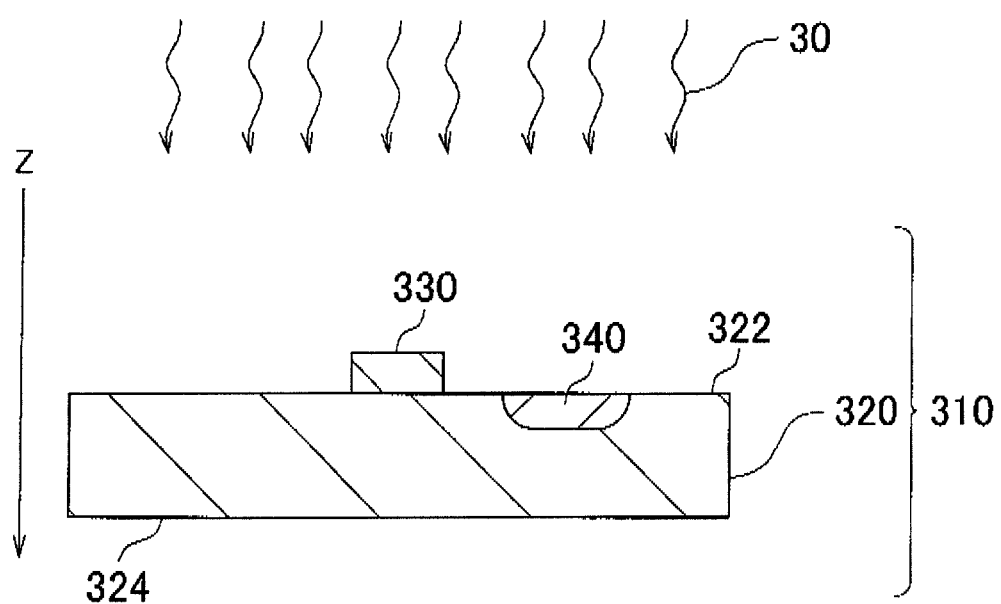
FIG. 3 schematically illustrates an exemplary cross-section of a semiconductor wafer 310.

FIG. 3 schematically illustrates an exemplary cross-section of a semiconductor wafer 310. The semiconductor wafer 310 includes a base wafer 320, a portion to be thermally processed 330, and an impurity-diffused region 340. The semiconductor wafer 310 is different from the semiconductor wafers 110 and 210 in that the absorptive layer that absorbs an electromagnetic wave 30 to beat the portion to be thermally processed 330 is omitted. To produce the semiconductor wafer 310, the portion to be thermally processed 330 is selectively heated by the electromagnetic wave 30 while the impurity-diffused region 340 is prevented from being heated.

In the present embodiment, the base wafer 320 is an SOI wafer or a Si wafer. The base wafer 320 has a first main plane 322 and a second main plane 324. The base wafer 320 includes a Si crystal in the first main plane 322. In the first main plane 322 of the base wafer 320, a semiconductor device is at least partially formed. In the first main plane 322 of the base wafer 320, for example, the impurity-diffused region 340, which forms a part of a semiconductor device, is formed.

The portion to be thermally processed 330 is equivalent to the portion to be thermally processed 130 shown in FIG. 1A. The portion to be thermally processed 330 includes, for example, a $Si_xGe_{1-x}$ crystal ($0 \leq x<1$). The portion to be thermally processed 330 is, for example, in contact with the first main plane 322 or the base wafer 320. Due to the difference in lattice constant between the base wafer 320 and the $Si_xGe_{1-x}$ crystal, and other factors, defects such as lattice defects may occur within the $Si_xGe_{1-x}$ crystal. The annealing of the $Si_xGe_{1-x}$ crystal by means of heating causes the defects to move within the $Si_xGe_{1-x}$ crystal, so that the defects are trapped by the boundary or the surfaces of the $Si_xGe_{1-x}$ crystal, an internal gettering sink of the $Si_xGe_{1-x}$ crystal, or the like. As a result, the $Si_xGe_{1-x}$ crystal can have a region with a reduced density of defects represented by threading dislocations that reach the surface of the $Si_xGe_{1-x}$ crystal and thus achieve high quality.

For example, the $Si_xGe_{1-x}$ crystal has a defect trap for trapping defects, which can move within the $Si_xGe_{1-x}$ crystal. For example, the defect trap is positioned such that the maximum distance between from any point within the $Si_xGe_{1-x}$ crystal to the defect trap is equal to or shorter than the distance by which defects can move when the annealing is performed at a certain temperature and for a certain duration. Here, an example of the defect trap is the boundary of the $Si_xGe_{1-x}$ crystal, the boundary between the $Si_xGe_{1-x}$ crystal and the side wall of the opening formed in an inhibition layer, or an internal gettering sink of the $Si_xGe_{1-x}$ crystal. The $Si_xGe_{1-x}$ crystal may be sized such that the maximum width of the $Si_xGe_{1-x}$ crystal does not exceed double the distance by which the defects can move when the annealing is performed at a certain temperature and for a certain duration.

The impurity-diffused region 340 is formed in at least a part of the base wafer 320. The impurity-diffused region 340 is formed in a portion of the base wafer 320, the portion being other than the portion on which the portion to be thermally processed 330 is provided. The impurity-diffused region 340 is, for example, a well, a source region, or a drain region of a MOSFET.

The impurities included in the impurity-diffused region 340 are diffused when heated. The semiconductor device requires a complicated thermal design if the impurity-diffused region 340 is exposed to a high temperature after formed. The complexity of the thermal design can be mitigated by maintaining the temperature of the impurity-diffused region 340 lower than the maximum reachable temperature of the portion to be thermally processed 330 even when the portion to be thermally processed 330 is heated.

To produce the semiconductor wafer 310, the electromagnetic wave 30 is applied to the base wafer 320. The wavelength of the electromagnetic wave 30 is selected such that the absorption coefficient of the $Si_xGe_{1-x}$ crystal for the electromagnetic wave 30 is higher than the absorption coefficient of the Si included in the SOI wafer or the Si wafer for the electromagnetic wave 30. For example, the electromagnetic wave 30 is light having a wavelength of no shorter than 1200 nm and no longer than 1800 nm. The light is absorbed by the $Si_xGe_{1-x}$ crystal ($0 \leq x<1$), but not absorbed by and transmits through the Si crystal.

When the above-described electromagnetic wave 30 is applied to the semiconductor wafer 310, the portion to be thermally processed 330 can be selectively heated. The electromagnetic wave 30 is applied in a similar manner to the electromagnetic wave 10. In other words, the portion to be thermally processed 330 is annealed in a similar manner to the portion to be thermally processed 130. The base wafer 320 may be preheated before the application of the electromagnetic wave 30 starts.

The base wafer 320 may include an active region of an electronic element that is to be formed in the base wafer 320. The electronic element is, for example, a semiconductor device such as a MOSFET, a MISFET, a hetero unction bipolar transistor (HBT) and a high electron mobility transistor (HEMT), a light emitting device such as a LED, a light receiving device such as an optical sensor, or a passive element such as a capacitor. Here, the electromagnetic wave 30 is preferably selected such that the absorption coefficient of the portion to be thermally processed 330 for the electromagnetic wave 30 is higher than the absorption coefficient of at least a partial region of the electronic element for the electromagnetic wave 30. The partial region is, for example, the active region of the electronic element.

The semiconductor device formed in the base wafer 320 may at least partially include a semiconductor and a dielectric that are in contact with each other. The boundary between the semiconductor and the dielectric is, for example, used as the MOS gate boundary formed in the active region of the MOSFET. The MOS gate boundary has a low thermal resistance. Accordingly, the characteristics of the MOSFET may be degraded if the MOS gate boundary is exposed to a high temperature for a long period of time.

Therefore, the portion to be thermally processed 330 is selectively heated using the electromagnetic wave 30 for which the portion to be thermally processed 330 has a higher absorption coefficient than Si. In this way, the boundary can be prevented from being exposed to a high temperature for a long period of time while the portion to be thermally processed 330 is heated. The wavelength of the electromagnetic wave 30 may be selected such that the absorption coefficient of the portion to be thermally processed 330 for the electromagnetic wave 30 is higher than the absorption coefficient of the semiconductor and the dielectric for the electromagnetic wave 30.

Figure 4:
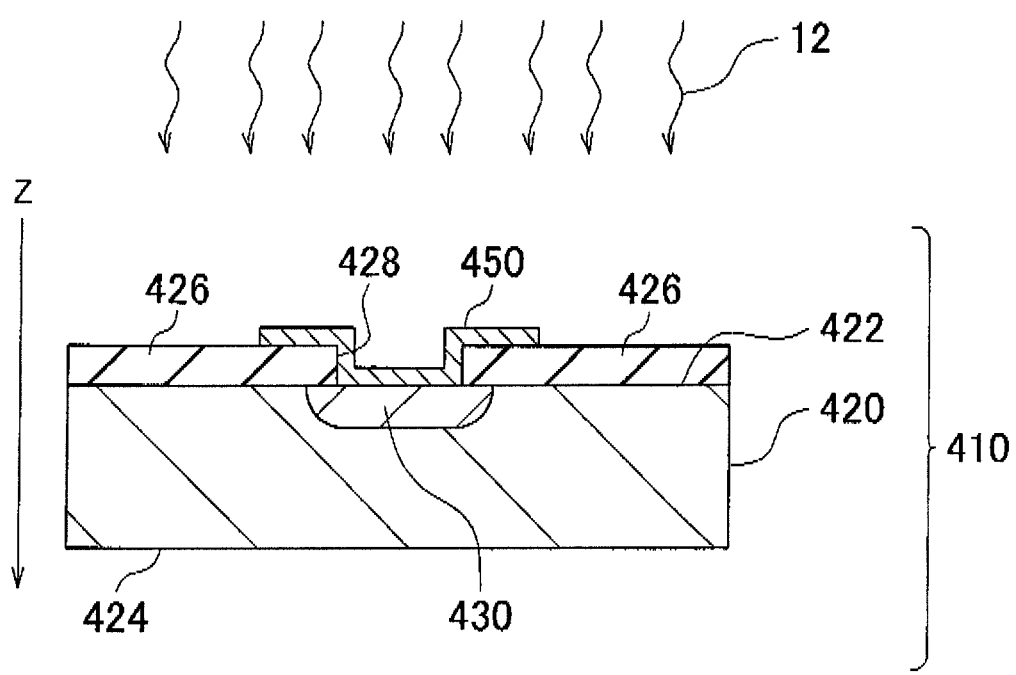
FIG. 4 schematically illustrates an exemplary cross-section of a semiconductor wafer 410.

FIG. 4 schematically illustrates an exemplary cross-section of a semiconductor wafer 410. The semiconductor wafer 410 is produced by applying an electromagnetic wave 12 to a base wafer 420. The base wafer 420 includes a protective layer 426, an impurity-introduced region 430, and an absorptive layer 450. The base wafer 420 has a first main plane 422 and a second main plane 424. The base wafer 420, the first main plane 422, and the second main plane 424 of the semiconductor wafer 410 are respectively equivalent to the base wafer 120, the first main plane 122, and the second main plane 124 of the semiconductor wafer 110.

The region 430 is shown as an example of the portion to be thermally processed 130. Impurities are introduced into the region 430, for example, by ion implantation. The absorptive layer 450 is provided above the region 430. The protective layer 426 protects, from the electromagnetic wave 12, a region of the base wafer 420, the region being other than the region to be heated. In the protective layer 426, an opening 428 is formed.

As used herein, the expression "above A" indicates any position on the line that originates at "A" and extends toward the application source of the electromagnetic wave 12 applied to the portion to be thermally processed 130. The position includes a position on the plane of "A." Here, "A" is, for example, the base wafer 120 and the portion to be thermally processed 130. In other words, the expression "above A" may indicate any position between "A" and the application source that applies the electromagnetic wave 12. More specifically, the absorptive layer 450 is positioned such that the region 430 is sandwiched between the absorptive layer 450 and the base wafer 420. For example, the expression "above the region 430" means any position on the opposite side of the base wafer 420 with respect to the boundary between the region 430 and the absorptive layer 450.

The expression "below A" indicates any position on the line that originates at "A" and extends in the direction opposite to the direction toward the application source of the electromagnetic wave applied to the portion to be thermally processed 130. In other words, the expression "below A" may mean any position on the opposite side, with respect to "A," to the expression "above A."

The semiconductor wafer 410 is produced by applying the electromagnetic wave 12 to the base wafer 420 to selectively heat the absorptive layer 450. When the electromagnetic wave 12 is applied to the entire base wafer 420, the protective layer 426 prevents the region excluding the region 430 from being heated by the electromagnetic wave 12. In this way, the maximum reachable temperature of the region excluding the region 430 can be maintained lower than the maximum reachable temperature of the region 430. As a result, the region 430 of the semiconductor wafer 410, the region 430 being covered with the absorptive layer 450, can be selectively heated. The impurity region can be activated by selectively heating the region 430.

The protective layer 426 blocks at least a part of the electromagnetic wave 12 so that the electromagnetic wave 12 has an attenuated intensity after transmitting through the protective layer 426. In this manner, the region positioned in the transmission direction of the electromagnetic, wave 12 is protected. Accordingly, the region having a lower thermal resistance than the portion to be thermally processed 130 can be protected from the electromagnetic wave 12 or the heat generated as a result of the application of the electromagnetic wave 12. The protective layer 426 may include a reflective layer that reflects at least a part of the electromagnetic wave 12. The reflective layer is, for example, a metal thin film made of Ag, Au, Al and the like.

The protective layer 426 may include a scattering layer that scatters at least a part of the electromagnetic wave 12. The scattering layer is, for example, a resin layer containing fine particles, or a layer constituted by dielectrics having different refractive indices in which fine particles are diffused. The line particles may be transparent fine particles, for example, ceramic fine particles such as colloidal silica. The scattering layer is formed, for example, by coating. The scattering layer scatters at least a part of the electromagnetic wave 10 that enters the protective layer 426 to change the travel direction of the electromagnetic wave 12. This increases the travel distance of the electromagnetic wave 12 within the protective layer 426 so that the electromagnetic wave 12 is prevented from reaching the region that is to be protected from the electromagnetic wave 12.

The protective layer 426 is made of more than one material. The reflector such as a metal thin film and the scatterer such as fine particles are embedded within, for example, a silicon oxide layer, a silicon nitride layer, a silicon oxynitride layer, an aluminum oxide layer, or a laminate of these layers.

The protective layer 426 may include a heat diffusing layer that diffuses the heat generated as a result of the application of the electromagnetic wave 12. In this manner, the protective layer 426 protects the region positioned in the direction in which the heat generated as a result of the application of the electromagnetic wave 12 is transferred. The heat diffusing layer is, for example, a silicon oxide layer, a silicon nitride layer, a silicon oxynitride layer, an aluminum oxide layer, or a laminate of these layers. The heat diffusing layer may be constituted by a plurality of layers. In this way, the thermal contact resistance between the layers reduces the conduction of the thermal energy, which can further reduces the amount of the heat that reaches the region that is expected to be protected from the electromagnetic wave 12.

For example, the protective layer 426 and the base wafer 420 are arranged in the stated order in the transmission direction of the electromagnetic wave 12. The protective layer 426 may be in contact with the first main plane 422 of the base wafer 420. In FIG. 4, the protective layer 426 is formed so as to cover the entire plane of the base wafer 420. Alternatively, however, the protective layer 426 may be formed so as to at least partially protect the portion of the base wafer excluding the region 430. For example, the protective layer 426 is formed above a low-thermal-resistance region in the semiconductor wafer 410.

The opening 428 penetrates through the protective layer 426 to reach the first main plane 422 in the substantially perpendicular direction to the first main plane 422, for example. The opening 428 externally exposes at least a part of the region 430. In the present embodiment, the protective layer 426 covers the region of the base wafer 420, the region being other than the region externally exposed by the opening 428. Therefore, The covered region is protected from the electromagnetic wave 12 or the heat generated as a result of the application of the electromagnetic wave 12. The size of the impurity region can be adjusted by adjusting the area of the region 430 that is externally exposed through the opening 428. In other words, the entire region 430 may not be externally exposed through the opening 428, but only a part of the region 430 may be externally exposed through the opening 428. The opening 428 can be formed, for example, by photolithography such as etching.

The absorptive layer 450 is the same as the absorptive layers 150 and 250 except that at least a part of the absorptive layer 450 is formed within the opening 428. The absorptive layer 450 is preferably formed so as to be in contact with at least a part of the region 430 within the opening 428. In this way, the absorptive layer 450 can beat the region 430 using the heat generated through the absorption of the electromagnetic wave 12. As a result, the absorptive layer 450 can selectively heat the region 430.

Subsequently, the electromagnetic wave 12 is applied to the base wafer 420 in a similar manner to the case where the semiconductor wafer 110 is produced. The wavelength of the electromagnetic wave 12 is selected such that the absorption coefficient of the absorptive layer 450 for the electromagnetic wave 12 is higher than the absorption coefficient of the region 430 for the electromagnetic wave 12. Furthermore, the wavelength of the electromagnetic wave 12 is selected such that the protective layer 426 blocks at least a part of the electromagnetic wave 12. The electromagnetic wave 12 is the same as the electromagnetic wave 10 except for that what wavelength is selected.

By selecting the wavelength of the electromagnetic wave 12 according to the above standards, even when the region 430 is unlikely to absorb the electromagnetic wave 12, the region 430 can be selectively heated by applying the electromagnetic wave 12 to the semiconductor wafer 410 to selectively heat the absorptive layer 450. Since the protective layer 426 blocks at least a part of the electromagnetic wave 12, the temperature of the region protected by the protective layer 426 can be maintained lower than the maximum reachable temperature of the region 430.

As discussed above, the impurity region is activated by selectively annealing the region 430 into which impurities have been introduced. The annealing of the region 430 can be performed under the same conditions as the annealing of the portion to be thermally processed 130. In addition, the semiconductor wafer 410 may be preheated before the application of the electromagnetic wave 12 starts.

Figure 5:
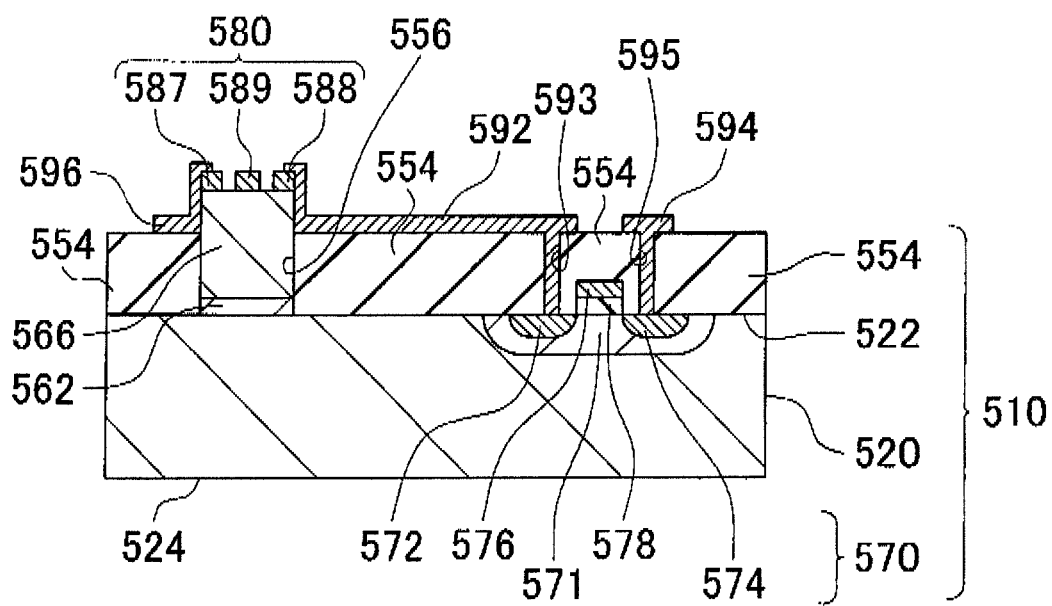
FIG. 5 schematically illustrates an exemplary cross-section of an electronic device 500.

FIG. 5 schematically illustrates an exemplary cross-section of an electronic device 500. The electronic device 500 includes a semiconductor wafer 510, a second electronic element 580, an interconnection 592, an interconnection 594, and an interconnection 596. The semiconductor wafer 510 includes a base wafer 520, an inhibition layer 554, a $Si_xGe_{1-x}$ crystal 562, and a group III-V compound semiconductor 566.

The base wafer 520 has a first main plane 522 and a second main plane 524. The base wafer 520 has, for example, a first electronic element 570 formed therein. The first electronic element 570 includes a well 571, a source region 572, a drain region 574, a gate electrode 576, and a gate insulator 578. In the inhibition layer 554, an opening 556, an opening 593, and an opening 595 are formed. The second electronic element 580 includes an input/output electrode 587, an input/output electrode 588, a gate electrode 589. The second electronic element 580 is formed on the group III-V compound semiconductor 566.

The inhibition layer 554 protects the first electronic element 570 from an electromagnetic wave. The semiconductor wafer 510 is produced by applying an electromagnetic wave that is unlikely to be absorbed by the inhibition layer 554 to the base wafer 520 to selectively heat the $Si_xGe_{1-x}$ crystal 562. The inhibition layer 554 may serve as a thermal conduction restraining layer that restrains the conduction of the heat generated as a result of the application of the electromagnetic wave to the first electronic element 570.

The inhibition layer 554 inhibits the precursors of the $Si_xGe_{1-x}$ crystal 562 and the group III-V compound semiconductor 566 from growing into crystals. For example, when the crystal of the group III-V compound semiconductor 566 is epitaxially grown by MOCVD, the inhibition layer 554 inhibits the crystal of the group III-V compound semiconductor 566 from epitaxially growing on the surface of the inhibition layer 554. The inhibition layer 554 is, for example, a silicon oxide layer, an aluminum oxide layer, a silicon nitride layer, a silicon oxynitride layer, a tantalum nitride layer, a titanium nitride layer, or a laminate formed by the above-mentioned layers. For example, the inhibition layer 554 has the thickness of 0.05 μm to 5 μm. The inhibition layer 554 is in contact with the first main plane 522 of the base wafer 520. The inhibition layer 554 can be formed, for example, by CVD.

The opening 556 penetrates through the inhibition layer 554 in the substantially perpendicular direction to the first main plane 522 to reach the first main plane 522. The opening 556 externally exposes the first main plane 522. In this way, a crystal can be selectively grown within the opening 556. The opening 556 can be formed by, for example, etching.

The openings 593 and 595 penetrate through the inhibition layer 554 in the substantially perpendicular direction to the first main plane 522. The opening 593 and the opening 595 externally expose the source region 572 and the drain region 574 respectively. Within the opening 593 and the opening 595, a part of the interconnection 592 and a part of the interconnection 594 are respectively formed. In this way, the first electronic element 570 is electrically coupled to another electronic element such as the second electronic element 580. The openings 593 and 595 can be formed, for example, by reactive ion etching.

The $Si_xGe_{1-x}$ crystal 562 is an exemplary seed crystal that provides a good seed plane for growing the group III-V compound semiconductor 566. Here, x represents a real number satisfying the condition of 0≤x<1. The $Si_xGe_{1-x}$ crystal 562 prevents the impurities present in the base wafer 520 or the first main plane 522 from adversely affecting the crystallinity of the group III-V compound semiconductor 566. The $Si_xGe_{1-x}$ crystal 562 is formed within the opening 556. The $Si_xGe_{1-x}$ crystal 562 is, for example, formed so as to be in contact with the first main plane 522.

The $Si_xGe_{1-x}$ crystal 562 can be formed, for example, by epitaxial growth such as CVD. Since the precursors of the $Si_xGe_{1-x}$ crystal 562 are inhibited from growing into a crystal on the surface of the inhibition layer 554, the $Si_xGe_{1-x}$ crystal 562 is selectively grown within the opening 556. In this manner, the $Si_xGe_{1-x}$ crystal 562 can be locally formed. The $Si_xGe_{1-x}$ crystal 562 is preferably annealed. The annealing of the $Si_xGe_{1-x}$ crystal 562 can be performed under the same conditions as the annealing of the portion to be thermally processed 130. The annealing can lower the density of the defects, mainly threading dislocations that reach as far as the surface, within the $Si_xGe_{1-x}$ crystal 562, and can provide a good seed plane for growing the group III-V compound semiconductor 566.

Referring to the above-mentioned annealing, after an absorptive layer that absorbs an electromagnetic wave to generate heat used to beat the $Si_xGe_{1-x}$ crystal 562 is formed on the wafer, an electromagnetic wave that is capable of being absorbed by the absorptive layer is applied to the wafer. In this manner, the $Si_xGe_{1-x}$ crystal 562 is heated. The ratio of the amount of the heat to be generated to the amount of the energy of the electromagnetic wave in the absorptive layer is preferably higher than the ratio of the amount of the heat to be generated to the amount of the energy of the electromagnetic wave applied when the electromagnetic wave is applied to at least a part of the inhibition layer 554 or the first electronic element 570. In this manner, in contrast with the inhibition layer 554 or the first electronic element 570, the $Si_xGe_{1-x}$ crystal 562 can be selectively heated even when the $Si_xGe_{1-x}$ crystal 562 may have a similar absorption coefficient to the inhibition layer 554 or the first electronic element 570 for an electromagnetic wave having a prescribed wavelength The group III-V compound semiconductor 566 has a lattice match or a pseudo lattice match with the $Si_xGe_{1-x}$ crystal 562. The group III-V compound semiconductor 566 is GaAs or the like. The group compound semiconductor 566 is, for example, in contact with the $Si_xGe_{1-x}$ crystal 562.

When the group 111-V compound semiconductor 566 is GaAs or a semiconductor having a lattice match or a pseudo lattice match with GaAs, x for the $Si_xGe_{1-x}$ crystal 562 preferably falls within the range of 0≤x≤0.1. More preferably, x−0. When x≤0.1, the difference in lattice constant between the $Si_xGe_{1-x}$ crystal 562 and the group III-V compound semiconductor 566 is further reduced and defects are thus unlikely to be generated.

As used herein, the term "a pseudo lattice match" indicates the state in which two semiconductors can be stacked together without a perfect lattice match but only a small difference exists between the lattice constants of the two semiconductors and the lattice mismatch produces no significant defects. The difference between the lattice constants is absorbed by elastic deformation of the crystal lattices of the respective semiconductors. For example, a pseudo lattice match is established between Ge and GaAs when the two different semiconductors are stacked together.

The boundary between the $Si_xGe_{1-x}$ crystal 562 and the group III-V compound semiconductor 566 may be positioned within the opening 556. The group III-V compound semiconductor 566 can be formed, for example, by epitaxial growth such as MOCVD. When the base wafer 520 is a Ge wafer or a GOI wafer, specifically speaking, a wafer having a $Si_xGe_{1-x}$ crystal (0≤x<1) in the first main plane 522, the group III-V compound semiconductor 566 may be formed so as to be in contact with the first main plane 522 with the $Si_xGe_{1-x}$ crystal (0<x<1) serving as a seed crystal.

When the group III-V compound semiconductor 566 is epitaxially grown by MOCVD, an absorptive layer that absorbs an electromagnetic wave to generate heat used to beat the $Si_xGe_{1-x}$ crystal 562 is formed on the wafer, and the source gas may then be supplied to the reaction chamber while the electromagnetic wave that is capable of being absorbed by the absorptive layer is applied to the base wafer 520. In this way, the group III-V compound semiconductor that has a lattice match or a pseudo lattice match with the $Si_xGe_{1-x}$ crystal can be selectively formed on the surface of the annealed $Si_xGe_{1-x}$ crystal 562.

In this case, the temperature of the base wafer 520, in particular, the temperature of the region in which the first electronic element 570 is formed is maintained at 650° C. or lower, preferably 450° C. or lower. Therefore, the heat-induced degradation of the first electronic element 570 can be restrained. Note that the temperature of the base wafer 520 is maintained at 650° C. or lower, preferably 450° C. or lower in either of the case where the $Si_xGe_{1-x}$ crystal 562 is formed on the base wafer 520 and the case where the $Si_xGe_{1-x}$ crystal 562 is annealed.

When the group III-V compound semiconductor 566 is grown by MOCVD, the pressure may be set at no lower than 0.1 kPa and no higher than 100 kPa. A high pressure is not preferable since crystals are likely to be grown on the inhibition layer. The pressure is preferably set at no higher than 50 kPa. The growth rate of the group III-V compound semiconductor 566 is dependent on the area ratio of the opening 556 formed in the inhibition layer 554. The area ratio is defined as the result of dividing the bottom area of the opening by the area of a portion of the wafer, the portion being in contact with the inhibition layer. As the area ratio of the opening 556 decreases, the growth rate increases since more precursors gather at the opening.

The first electronic element 570 may be formed in a region of the base wafer 520, the region being other than the region that is externally exposed through the opening 556. In the present embodiment, the first electronic element 570 is exemplified by a MOSFET. The first electronic element 570, however, may be a different element than a MOSFET.

The first electronic element 570 includes, for example, at least one among the driving circuit for the second electronic element 580, the correction circuit for improving the linearity of the input and output characteristics of the second electronic element 580, and the protection circuit for the input stage of the second electronic element 580. The first electronic element 570 may be an active element included in a semiconductor device such as a MISFET, a HBT and a HEMT, a light emitting device such as a semiconductor laser, a light emitting diode, and a light emitting thyristor, a light receiving device such as a photodiode and an optical sensor, and a device such as a solar cell. The first electronic element 570 may be a passive element such as a resistor, a capacitor, and an inductor.

In the present embodiment, the second electronic element 580 is exemplified by an HBT. Alternatively, however, the second electronic element 580 may include at least one electronic element among an analog electronic device, a light emitting device such as an LED, and a light receiving device such as an optical sensor. The second electronic element 580 may be an active element included in a semiconductor device such as a MOSFET, a MISFET, a HBT and a HEMT, a light emitting device such as a semiconductor laser, a light emitting diode, and a light emitting thyristor, a light receiving device such as a photodiode and an optical sensor, and a solar cell. The first electronic element 570 may be a passive element included in a resistor, a capacitor, and an inductor.

The input/output electrode 587, the input/output electrode 588, and the gate electrode 589 are, for example, made of an electrically conductive material. The input/output electrode 587, the input/output electrode 588, and the gate electrode 589 are made of a metal such as Al, W or Ti, or a highly impurity-doped semiconductor. The input/output electrode 587, the input/output electrode 588, and the gate electrode 589 can be formed, for example, by vacuum evaporation and plating.

The interconnections 592, 594, and 596 electrically couple the first electronic element 570 or the first electronic element 570 to another electronic element or the like. The interconnections 592, 594, and 596 may be made of an electrically conductive material. For example, the interconnections 592, 594, and 596 can be made of a metal such as Al, Cu, Au, W or Ti, or an impurity-doped semiconductor. The interconnections 592, 594, and 596 can be formed, for example, by vacuum evaporation and plating.

The semiconductor wafer 510 may include a plurality of first electronic elements 570. Each first electronic element 570 may be electrically coupled to a plurality of second electronic elements 580. The semiconductor wafer 510 may include a plurality of second electronic elements 580. Each second electronic element 580 may be electrically coupled to a plurality of first electronic elements 570.

Figure 6:
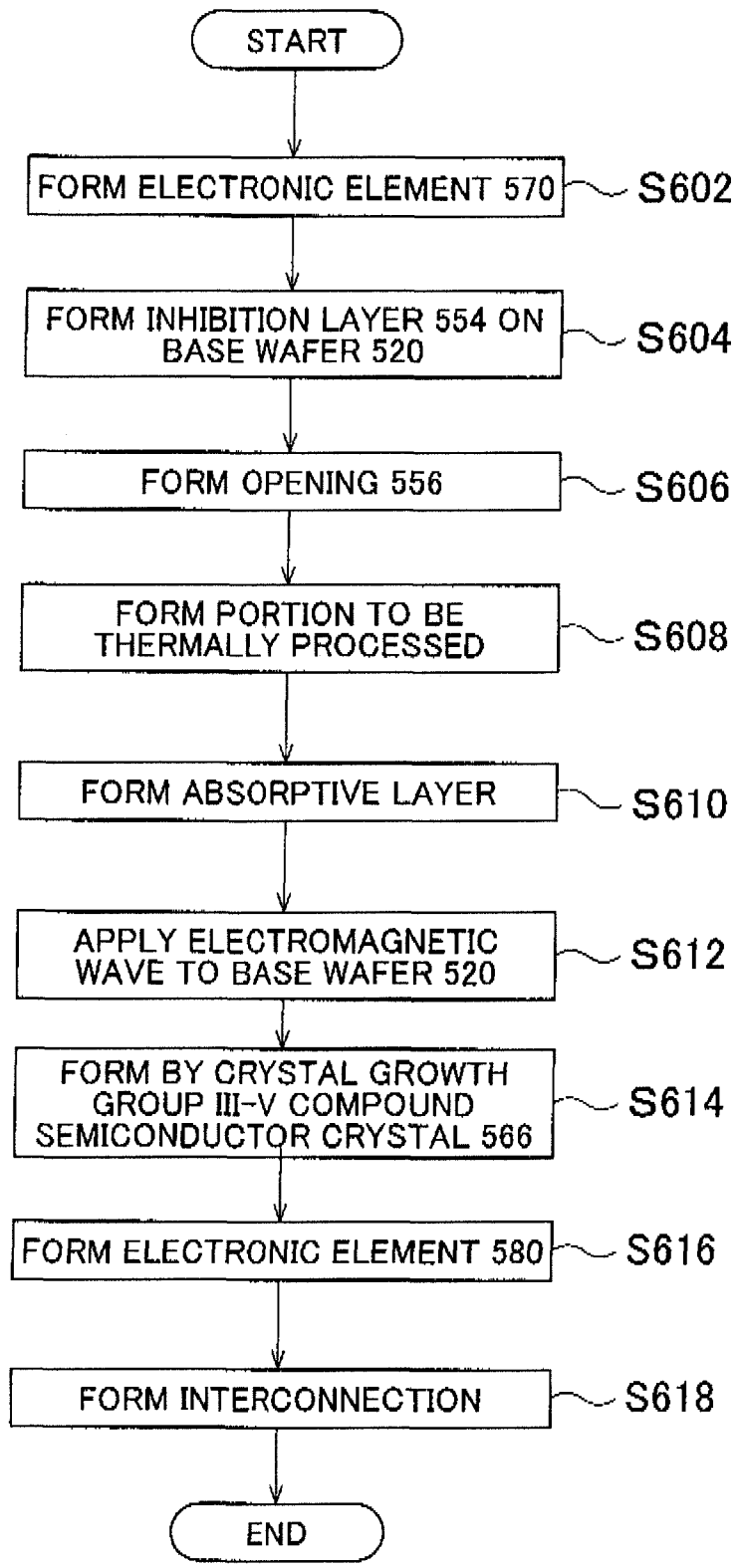
FIG. 6 is a flow chart to illustrate an exemplary method of producing the electronic device 500.

FIG. 6 is a flow chart to illustrate an exemplary method of producing the electronic device 500. In a step S602, the first electronic element 570 is formed on the base wafer 520. Subsequently, in a step S604, the inhibition layer 554 is formed to cover at least the first electronic element 570. The inhibition layer 554 serves to inhibit the precursors of the $Si_xGe_{1-x}$ crystal 562 from growing into a crystal and to protect the first electronic element 570 from the electromagnetic wave 10. Subsequently, in a step S606, the opening 556 is formed in a region of the inhibition layer 554, the region being other than the region that covers the first electronic element 570. The opening 556 penetrates through the inhibition layer 554 to reach the base wafer 520.

Subsequently, in a step S608, the $Si_xGe_{1-x}$ crystal 562 is formed as a portion to be thermally processed, within the opening 556. In other words, the precursors of the $Si_xGe_{1-x}$ crystal 562 are grown into a crystal within the opening 556. Furthermore, in a step S610, an absorptive layer is provided that absorbs the electromagnetic wave 10 to selectively heat the $Si_xGe_{1-x}$ crystal 562. In a step S612, the electromagnetic wave is applied to the base wafer while the entire base wafer is heated. Thus, the $Si_xGe_{1-x}$ crystal 562 is annealed by the heat generated by the absorptive layer.

After this, in a step S614, the group III-V compound semiconductor 566 is formed, by crystal growth, on the $Si_xGe_{1-x}$ crystal 562. In a step S616, the second electronic element 580 is formed on the group III-V compound semiconductor 566. Finally in a step S618, the openings 593 and 595 are formed in the inhibition layer 554. Furthermore, the interconnections 592, 594, and 596 are formed. Thus, the electronic device 500 is produced.

Figure 7:
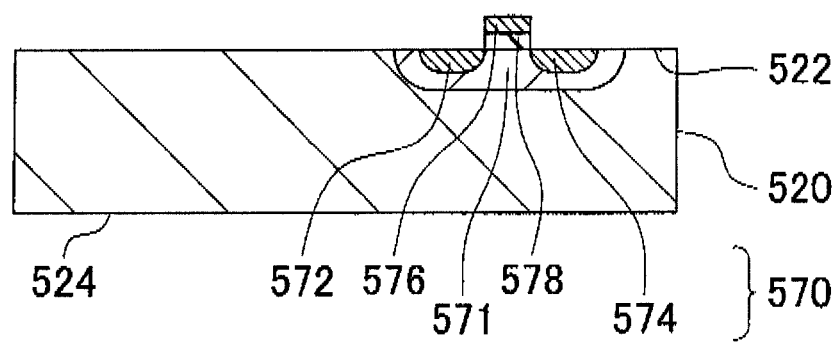
FIG. 7 schematically illustrates an exemplary cross-section observed during the production process of a semiconductor wafer 510.

The following describes an exemplary method for producing the semiconductor wafer 510 with reference to FIGS. 7 to 11. FIG. 7 schematically illustrates an exemplary cross-section observed during the production process of the semiconductor wafer 510. The first electronic element 570 is first formed on the base wafer 520. As shown in FIG. 7, at least a part of the first electronic element 570 is formed on the base wafer 520. The base wafer 520 is, for example, a Si wafer or an SOI wafer.

Figure 8:
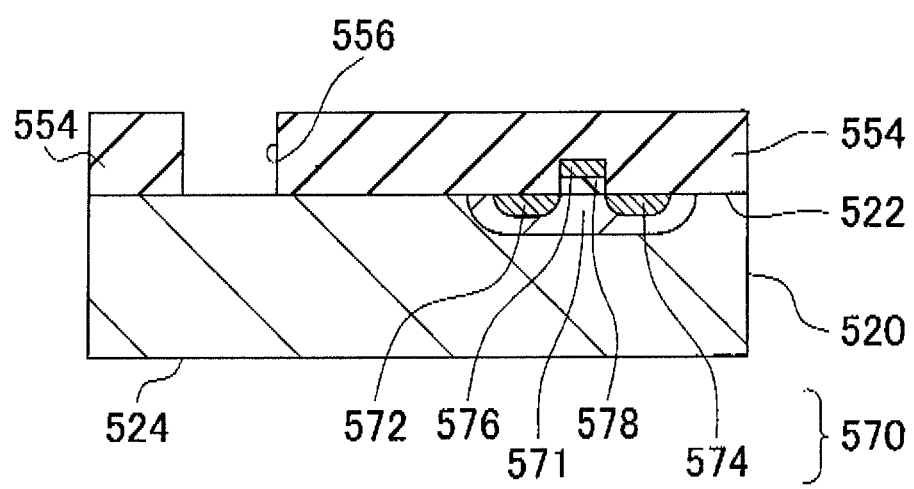
FIG. 8 schematically illustrates an exemplary cross-section observed during the production process of the semiconductor wafer 510.

FIG. 8 schematically illustrates an exemplary cross-section observed during the production process of the semiconductor wafer 510. As shown in FIG. 8, the inhibition layer 554 is formed in contact with the first main plane 522 of the base wafer 520. The inhibition layer 554 is, for example, made of $SiO_2$. The inhibition layer 554 has the thickness of, for example, 0.05 μm to 5 μm. The inhibition layer 554 may be formed by CVD. In the inhibition layer 554, for example, the opening 556 is formed by photolithography such as etching. The opening 556 may have an aspect ratio of $(\sqrt{3})/3$ or higher.

Figure 9:
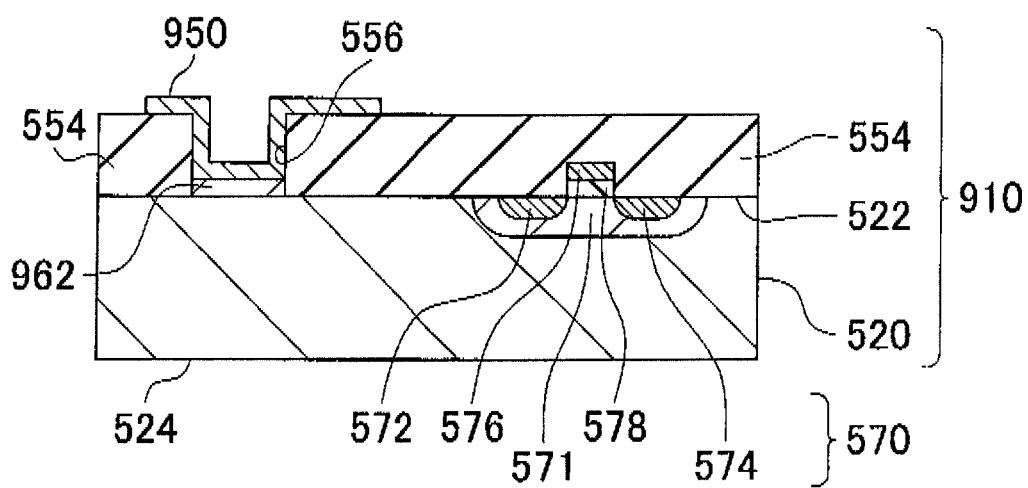
FIG. 9 schematically illustrates an exemplary semiconductor wafer 910 observed during the production process of the semiconductor wafer 510.

FIG. 9 schematically illustrates an exemplary semiconductor wafer 910 observed during the production process of the semiconductor wafer 510. As shown in FIG. 9, a $Si_xGe_{1-x}$ crystal 962, which is shown as an exemplary portion to be thermally processed, is formed within the opening 556 by epitaxial growth. The $Si_xGe_{1-x}$ crystal 962 corresponds to the portion to be thermally processed 130 described with reference to FIGS. 1A to 2. In the step of lowering the lattice defect density, the lattice defect density of the $Si_xGe_{1-x}$ crystal 962 is lowered by applying an electromagnetic wave to the $Si_xGe_{1-x}$ crystal 962.

Before the application of the electromagnetic wave to the $Si_xGe_{1-x}$ crystal 962 starts, an absorptive layer 950 is formed on the $Si_xGe_{1-x}$ crystal 962. The absorptive layer 950 may be at least partially formed within the opening 556. The absorptive layer 950 may be formed so as to be in contact with at least a part of the $Si_xGe_{1-x}$ crystal 962. The absorptive layer 950 is made of, for example, amorphous silicon. The absorptive layer 950 can be formed, for example, by CVD.

The $Si_xGe_{1-x}$ crystal 962 is formed, for example, by CVD using a source gas containing halogen. Since the precursors of the $Si_xGe_{1-x}$ crystal 962 are inhibited from growing into a crystal on the surface of the inhibition layer 554, the $Si_xGe_{1-x}$ crystal 962 is selectively grown within the opening 556. Here, defects such as lattice defects may occur within the $Si_xGe_{1-x}$ crystal 962.

Annealing the $Si_xGe_{1-x}$ crystal 962 can reduce the density of the defects within the $Si_xGe_{1-x}$ crystal 562. However, since a part of the first electronic element 570 has already been formed on the base wafer 520, high-temperature annealing at the temperature of 800° C. to 900° C. may damage the first electronic element 570. In addition, the impurities included in the well 571, the source region 572, and the drain region 574 are further diffused. In the present embodiment, however, the inhibition layer 554 protects the first electronic element 570 from the electromagnetic wave. Thus, the first electronic element 570 can be prevented from being damaged.

To protect the first electronic element 570 from the electromagnetic wave, the wavelength of the electromagnetic wave is preferably selected such that the inhibition layer 554 and the first electronic element 570 have a low absorption coefficient for the electromagnetic wave. In this case, the $Si_xGe_{1-x}$ crystal 962 may also have a low absorption coefficient for the electromagnetic wave. If such is the case, the $Si_xGe_{1-x}$ crystal 962 may not be capable of being efficiently heated.

Even in this case, the $Si_xGe_{1-x}$ crystal 962 can be selectively heated by providing the absorptive layer 950 that is adapted such that the ratio of the amount of the heat to be generated to the amount of the energy of the electromagnetic wave to be applied is higher than the ratio of the amount of the heat to be generated to the amount of the energy of the electromagnetic wave applied when the electromagnetic wave is applied to the $Si_xGe_{1-x}$ crystal 962. Here, the absorptive layer 950 is preferably positioned closer to the $Si_xGe_{1-x}$ crystal 962 than to the first electronic element 570. In this manner, even when the upper temperature limit of the first electronic element 570 is lower than the temperature at which the $Si_xGe_{1-x}$ crystal 962 is annealed, the $Si_xGe_{1-x}$ crystal 962 can be selectively heated without damaging the first electronic element 570.

The ratio of the amount of the heat to be generated to the amount of the energy of the electromagnetic wave to be applied in the absorptive layer 950 is preferably higher than the ratio of the amount of the heat to be generated to the amount of the energy of the electromagnetic wave applied when the electromagnetic wave is applied to the first electronic element 570. In this way, the $Si_xGe_{1-x}$ crystal 962 can be selectively heated without damaging the first electronic element 570.

Here, before the step of selectively heating the $Si_xGe_{1-x}$ crystal 962, the semiconductor wafer 910 may be preheated. The preheating can be performed in the following manner, for example. The second main plane 524 of the base wafer 520 is kept in contact with a support that has been heated to a prescribed temperature, so that the thermal conduction from the support to the semiconductor wafer 910 heats the entire semiconductor wafer 910 to beat the $Si_xGe_{1-x}$ crystal 962 and the first electronic element 570. Alternatively, the preheating can be performed by applying an electromagnetic wave that is to be absorbed by the base wafer 520 from the side of the second main plane 524 of the base wafer 520 to beat the entire semiconductor wafer 910. Note that the preheating is performed to such an extent that the temperature of the first electronic element 570 does not exceed the temperature at which the first electronic element 570 thermally deteriorate.

Figure 10:
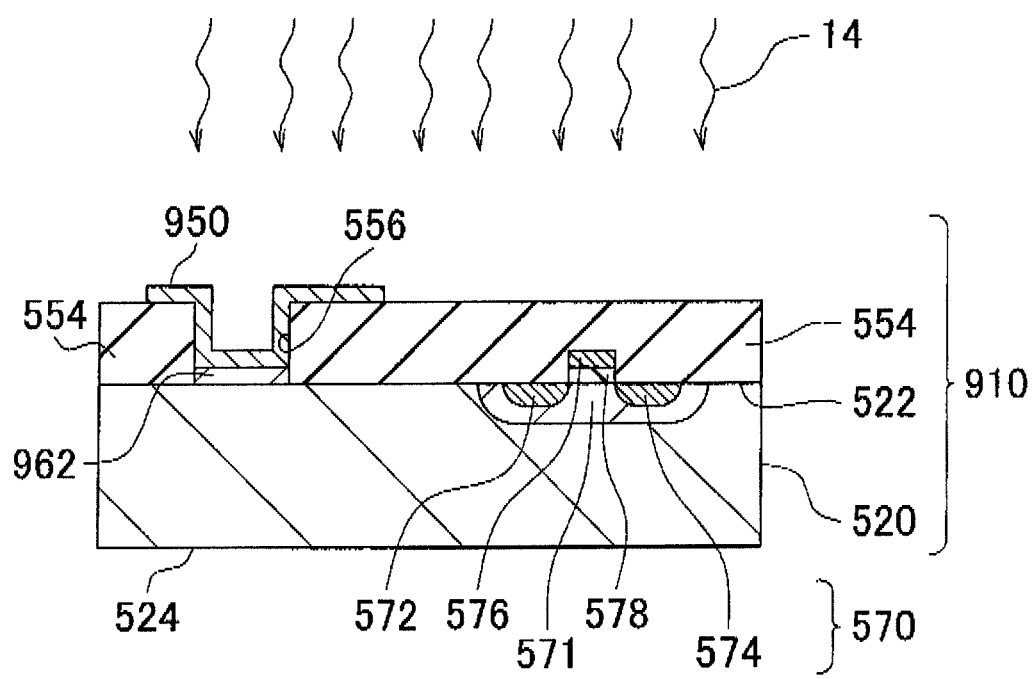
FIG. 10 schematically illustrates the exemplary semiconductor wafer 910 observed during the production process of the semiconductor wafer 510.

FIG. 10 schematically illustrates the exemplary semiconductor wafer 910 observed during the production process of the semiconductor wafer 510. As shown in FIG. 10, an electromagnetic wave 14 is applied to the base wafer 520 from above. The electromagnetic wave 14 may be continuous light, or a flash produced by a flash lamp. The electromagnetic wave 14 is the same as the electromagnetic wave 10 except for which wavelength is selected.

In the present embodiment, the wavelength of the electromagnetic wave 14 is selected such that the absorption coefficients of the inhibition layer 554 and the first electronic element 570 for the electromagnetic wave 14 are lower than the absorption coefficient of the absorptive layer 950 for the electromagnetic wave 14. The electromagnetic wave 14 is absorbed by the absorptive layer 950 so that the absorptive layer 950 is selectively heated. The heat transfer from the absorptive layer 950 heats the $Si_xGe_{1-x}$ crystal 962, so that the $Si_xGe_{1-x}$ crystal 962 is annealed. This annealing can be performed under the same conditions as the annealing of the portion to be thermally processed 130. Here, since the first electronic element 570 is unlikely to absorb the electromagnetic wave 14, the rise in the temperature of the first electronic element 570 is prevented.

The annealing lowers the defect density of the $Si_xGe_{1-x}$ crystal 962. Thus, the $Si_xGe_{1-x}$ crystal 562 achieves superior crystallinity. The average dislocation density is, for example, $10^5$ cm$^{-2}$ or lower for the threading dislocations that reach as far as the surface of the $Si_xGe_{1-x}$ crystal 562. Stated differently, in the step of lowering the lattice defect density of the $Si_xGe_{1-x}$ crystal 562, the application of the electromagnetic wave 14 can lower the average dislocation density within the $Si_xGe_{1-x}$ crystal 562 to $10^5$ cm$^{-2}$ or lower. The average dislocation density can be measured by the etch-pit method or plan-view cross-sectional observation based on a transmission electron microscope. After the $Si_xGe_{1-x}$ crystal 562 is formed, the absorptive layer 950 may be removed by etching or the like.

The step of growing the precursors of the $Si_xGe_{1-x}$ crystal 962 into a crystal, the step being described in connection with FIG. 9, and the step of lowering the lattice defect density of the $Si_xGe_{1-x}$ crystal 962, the step being described in connection with FIG. 10, may be performed in the same reaction chamber. Furthermore, the step of growing the precursors of the $Si_xGe_{1-x}$ crystal 962 into a crystal may be successively followed by the step of lowering the lattice defect density of the $Si_xGe_{1-x}$ crystal 962, without exposing the $Si_xGe_{1-x}$ crystal 962 to air between the steps.

Figure 11:
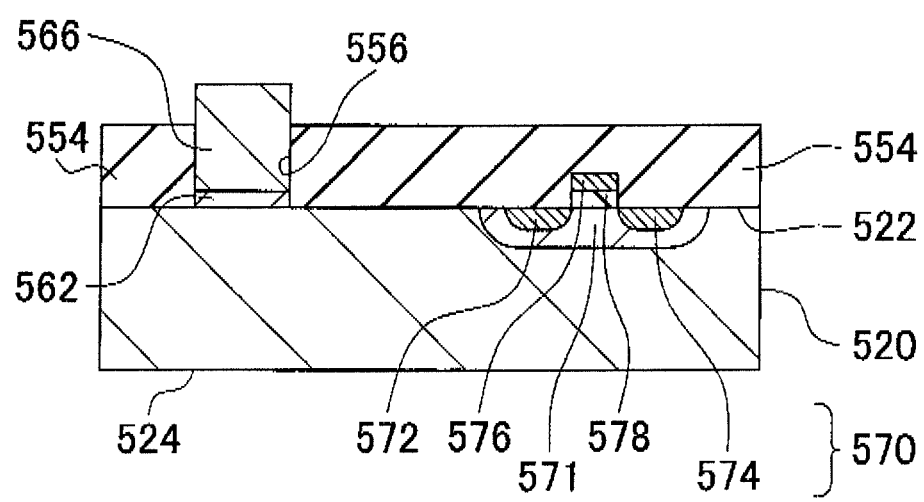
FIG. 11 schematically illustrates an exemplary cross-section of the semiconductor wafer 510.

FIG. 11 schematically illustrates an exemplary cross-section of the semiconductor wafer 510. In FIG. 11, the absorptive layer 950 shown in FIG. 10 has been removed by etching or the like. After the absorptive layer 950 is removed, the group III-V compound semiconductor 566 is formed on the $Si_xGe_{1-x}$ crystal 962 having a lowered average dislocation density. The group III-V compound semiconductor 566 preferably has a lattice match or a pseudo lattice match with the $Si_xGe_{1-x}$ crystal 562.

The group III-V compound semiconductor 566 is epitaxially grown by using as a seed plane the surface of the $Si_xGe_{1-x}$ crystal 562 having superior crystallinity. The group III-V compound semiconductor 566 can be formed by, for example, MOCVD. After this, the second electronic element 580, the interconnection 592, the interconnection 594, the interconnection 596 and the like are formed, and the first electronic element 570 is electrically coupled to the second electronic element 580. In this manner, the electronic device 500 is produced.

The step of forming, by crystal growth, the group III-V compound semiconductor may be performed using the light source used to apply the electromagnetic wave in the step of lowering the lattice defect density of the $Si_xGe_{1-x}$ crystal 562 and involve applying the same electromagnetic wave again to the base wafer 520.

In FIG. 11, the absorptive layer 950 shown in FIG. 10 has been removed. Alternatively, however, a part of the absorptive layer 950 may be left. For example, when the absorptive layer 950 is an insulator or an insulator precursor, the left part of the absorptive layer 950 can insulate the group III-V compound semiconductor 566 and the base wafer 520 from each other. The insulator precursor may be a group III-V compound semiconductor that becomes an insulator by oxidation. For example, the insulator precursor is a group III-V compound semiconductor including Al or B. The insulator is, for example, an oxide dielectric obtained by oxidizing an insulator precursor including a group III-V compound semiconductor including Al. The insulator and the insulator precursor may have a lattice match or a pseudo lattice match with the $Si_xGe_{1-x}$ crystal 562.

Depending on the position at which the absorptive layer is formed and the type of the absorptive layer, the group III-V compound semiconductor 566 may be formed, by crystal growth, with the absorptive layer being still formed on the semiconductor wafer 910. In this manner, the group III-V compound semiconductor 566, which has a lattice match or a pseudo lattice match with the $Si_xGe_{1-x}$ crystal 562, can be formed while the rise in the temperature of the first electronic element 570 is prevented. For example, the absorptive layer is positioned in the inhibition layer 554 closer to the $Si_xGe_{1-x}$ crystal 562 than to the first electronic element 570. While an electromagnetic wave that is capable of being absorbed by the absorptive layer is applied to the wafer, the source gas is supplied to the reaction chamber. In this manner, the group III-V compound semiconductor, which has a lattice match or a pseudo lattice match with the $Si_xGe_{1-x}$ crystal 562, can be selectively formed on the surface of the annealed $Si_xGe_{1-x}$ crystal 562.

Here, the temperature of the base wafer 520, in particular, the temperature of the region in which the first electronic element 570 is formed is preferably maintained at 650° C. or lower, more preferably 450° C. or lower. This can further prevent the thermal deterioration of the first electronic element 570. While the $Si_xGe_{1-x}$ crystal 562 is formed on the base wafer 520, while the semiconductor wafer 910 is preheated, and while the $Si_xGe_{1-x}$ crystal 562 is annealed, the temperature of the base wafer 520 is also preferably maintained at 650° C. or lower, more preferably 450° C. or lower.

In the present embodiment, the case where the wavelength of the electromagnetic wave 14 is selected such that the absorption coefficients of the inhibition layer 554 and the first electronic element 570 for the electromagnetic wave 14 are lower than the absorption coefficient of the absorptive layer 950 for the electromagnetic wave 14 has been explained. However, the method for producing the electronic device 500 is not limited in this regard. A base wafer including Si, such as an SOI wafer or a Si wafer may be provided as the base wafer 520, and an electromagnetic wave for which the absorption coefficient of the $Si_xGe_{1-x}$ crystal is higher than the absorption coefficient of the Si included in the SOI wafer or the Si wafer is applied to the $Si_xGe_{1-x}$ crystal 562. In this way, the $Si_xGe_{1-x}$ crystal 562 may be selectively heated. In this case, the absorptive layer 950 may be omitted.

Figure 12:
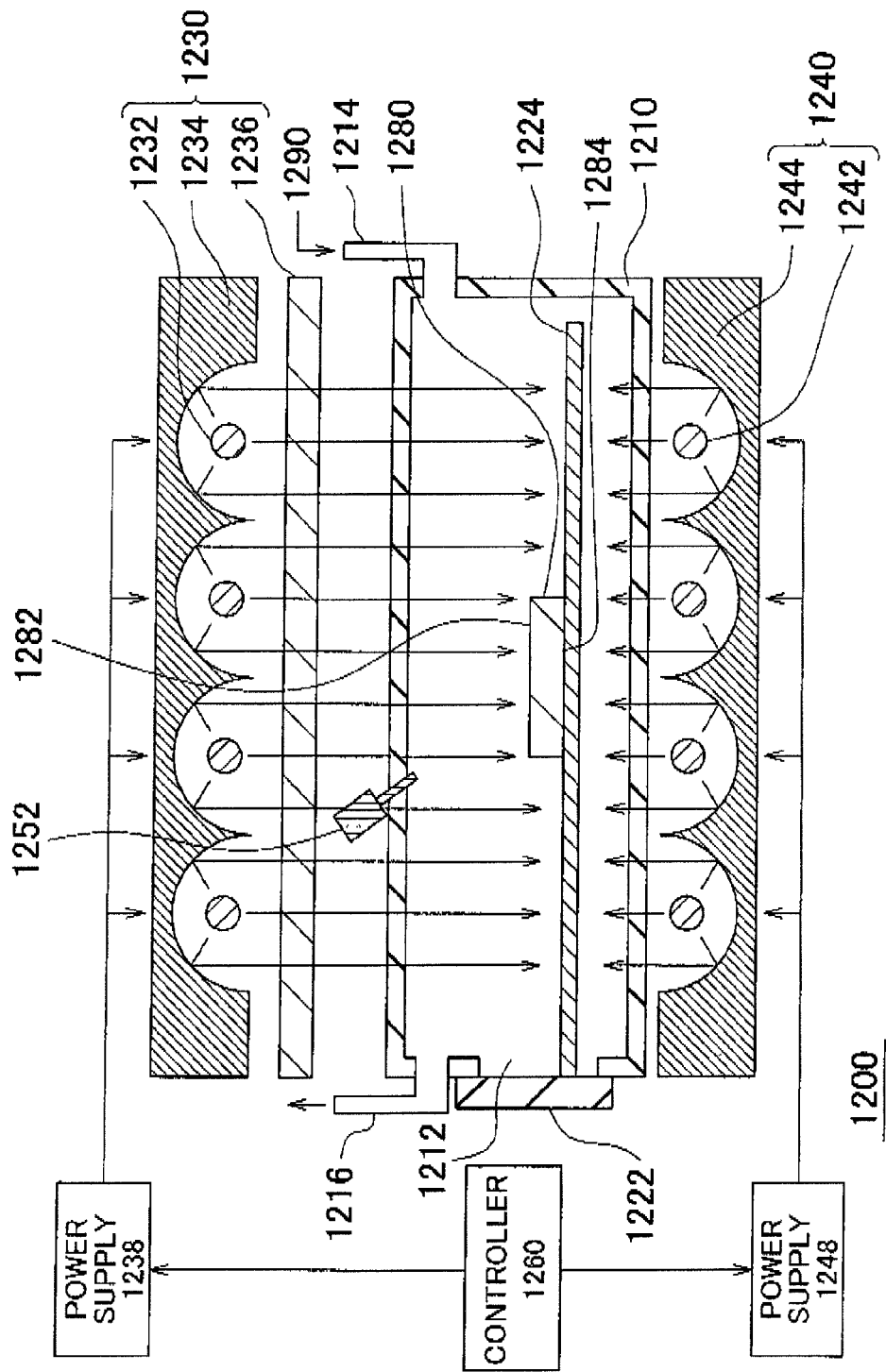
FIG. 12 schematically illustrates an exemplary cross-section of a thermal process apparatus 1200.

FIG. 12 schematically illustrates an exemplary cross-section of a thermal process apparatus 1200. FIG. 12 shows the thermal process apparatus 1200 together with a base wafer 1280 held within the thermal process apparatus 1200. The thermal process apparatus 1200 is shown as an exemplary reaction apparatus. The base wafer 1280 has the same configuration as, for example, any or the base wafer 120, the base wafer 320, the base wafer 420, and the base wafer 520. On a first main plane 1282 of the base wafer 1280, the portion to be thermally processed 130 that is to be thermally processed and the absorptive layer 150 are disposed, for example.

The thermal process apparatus 1200 is shown as an exemplary reaction apparatus. For example, the thermal process apparatus 1200 performs a thermal process such as flash annealing on the base wafer 1280. The thermal process apparatus 1200 may also serve as a CVD apparatus that forms a Si crystal, a $Si_xGe_{1-x}$ crystal ($0 \leq x < 1$), a compound semiconductor crystal and the like on the base wafer 1280.

The thermal process apparatus 1200 includes a thermal process furnace 1210, a lamp unit 1230, a lamp unit 1240, an radiation thermometer 1252, and a controller 1260. The thermal process furnace 1210 has a wafer loading opening 1212, a gas inlet 1214, a gas outlet 1216, and a flap 1222. The lamp unit 1230 has lamps 1232, a reflector 1234, a filter 1236, and a power supply 1238. The lamp unit 1240 has lamps 1242, a reflector 1244, and a power supply 1248.

The thermal process furnace 1210 houses the base wafer 1280 therein. The thermal process furnace 1210 is shown as an exemplary reaction chamber. The thermal process furnace 1210 is, for example, hollow and has a cylindrical shape. The wafer loading opening 1212 is used to load or unload the base wafer 1280. The flap 1222 tightly closes the wafer loading opening 1212. The flap 1222 may include a support 1224 that supports the base wafer 1280 within the thermal process apparatus 1200. In this way, the base wafer 1280 can be retained within the thermal process furnace 1210.

The support 1224 is, for example, a graphite susceptor. On the support 1224, a temperature sensor may be disposed as a heating temperature measuring section that measures the temperature or the support 1224. The base wafer 1280 may be placed on the support 1224 in contact with the support 1224. In this case, the temperature of the lower portion of the base wafer 1280 is substantially the same as the temperature of the support 1224. Accordingly, the above-mentioned temperature sensor can measure the temperature of the back plane of the base wafer 1280. For example, the temperature sensor can measure the temperature of a low-heat-resistance portion formed in the base wafer 1280. The temperature sensor may measure the temperature of a region of the base wafer 1280, the region being in the vicinity of the Si device or the group III-V compound semiconductor device termed in the base wafer 1280.

An inert gas or the like is supplied into the thermal process furnace 1210 through the gas inlet 1214. Furthermore, the gas present within the thermal process furnace 1210 may be discharged through the gas outlet 1216. The gas inlet 1214 supplies, into the thermal process furnace 1210, a source gas used by CVD, MOCVD and the like. For example, the gas inlet 1214 supplies, into the thermal process furnace 1210, a source gas 1290, a carrier gas, and the like. The carrier gas is, for example, a hydrogen gas.

The source gas 1290 experiences a reaction within the thermal process furnace 1210, as a result of which a semiconductor crystal is epitaxially grown on the base wafer 1280 retained within the thermal process furnace 1210. The residual gas and the like present within the reaction chamber is discharged through the gas outlet 1216. Although not shown, the gas outlet 1216 may be connected to a vacuum system.

The temperature of the source gas 1290 is lower than the temperature of the base wafer 1280. It is preferable that the source gas 1290 is used to cool the base wafer 1280 while an electromagnetic wave is applied to the base wafer 1280 to epitaxially grow a semiconductor crystal. By cooling the base wafer 1280 while applying an electromagnetic wave to the baser wafer 1280, the portion to be thermally processed 130 can be selectively heated with it being possible to maintain the difference in temperature between the portion to be thermally processed 130 and the remaining region of the base wafer 1280.

The lamp unit 1230 is shown as an exemplary applying section. The lamp unit 1230 is positioned so as to face the first main plane 1282 of the base wafer 1280. The lamp unit 1230 applies an electromagnetic wave to the base wafer 1280 from the side of the first main plane 1282 of the base wafer 1280. In this manner, the lamp unit 1230 heats the base wafer 1280.

Each lamp 1232 generates an electromagnetic wave. Each lamp 1232 generates, for example, light including infrared light. Each lamp 1232 may generate incoherent light to uniformly apply an electromagnetic wave to the entire base wafer 1280. For example, the thermal process apparatus 1200 is configured such that a large number of low-cost light sources are arranged in parallel in order to uniformly apply an electromagnetic wave to the entire base wafer 120. Consequently, the thermal process apparatus 1200 can thermally process the base wafer 120 having a large area by a single operation. The lamps 1232 are each, for example, a high-intensity discharge lamp, a halogen lamp, a xenon lamp, or an LED lamp. The high-intensity discharge lamp is, for example, a high-pressure mercury lamp, a metal halide lamp, or a sodium lamp.

The lamp unit 1230 may continuously apply an electromagnetic wave, or apply an electromagnetic wave that has been pulsed, multiple times. The lamp unit 1230 may determine the duration of each pulse of an electromagnetic wave and the number of the pulses of the electromagnetic wave according to the purpose of the application of the electromagnetic wave.

For example, the lamp unit 1230 performs flash annealing by applying, to the base wafer 1280, an electromagnetic wave that has been pulsed, multiple times. To perform flash annealing, the lamp unit 1230 applies flashes to the base wafer 1280 using flash lamps such as xenon lamps. The superficial portion or the base wafer 1280 is heated to a high temperature of, for example, 1000° C. or higher within a short period of time. Furthermore, the base wafer 1280 is scanned while the flashes produced by the flash lamps are applied to the base wafer 1280. Consequently, the entire plane of the base wafer 1280 is heated.

The pulse of the electromagnetic wave applied by the flash lamps has a width of, for example, 1 ns to 100 ms. When the base wafer 1280 is thermally processed at a high temperature, the pulse of the electromagnetic wave preferably has a short width. However, the pulse width of shorter than 0.1 ms makes it difficult to control the light pulse. Therefore, the pulse width of the electromagnetic wave is preferably 0.1 ms to 10 ms. As used herein, the term "pulse width" represents the duration for which the level of the pulse waveform remains at or above half the peak value.

The dose of the flash can be arbitrarily selected depending on what is to be thermally processed and what lamps are available. The dose is, for example, set to 2 to 50 J/cm². As used herein, a dose of a flash lamp is defined as a result of dividing the energy (unit: J) of the electromagnetic wave output from the flash lamp by the area (unit: cm²) of a region of the base wafer 1280, the region being exposed to the flash output from the flash lamp.

When a flash is applied in multiple pulses, the interval between the pulses of the flash is determined considering the output performance of the flash source and the repetitive charge/discharge performances of the flash source, and the heat releasing characteristics of the portion to be thermally processed 130. For example, the interval between the pulses is determined such that the temperature of the portion to be thermally processed 130 reaches a temperature necessary for annealing while the temperature of a portion of the base wafer 1280, the portion being other than the portion to be thermally processed 130, does not reach a prescribed temperature or higher. The interval between the pulses is, for example, 1 s or longer.

When the interval between the pulses is too short, the requirement for the charge/discharge equipment becomes excessively high. In addition, the temperature of the region other than the portion to be thermally processed 130 may unnecessarily rise since the thermal energy is not sufficiently released from the base wafer 1280. On the other hand, when the interval between the pulses is too long, a long period of time is required to complete a thermal process and an increased energy is required for the thermal process.

The number of pulses produced by the flash lamps and the width of each pulse may be freely set so that the portion to be thermally processed 130 is annealed to a sufficient extent. By adjusting the number of pulses produced by the flash lamps or the width of each pulse, the temperature and duration of the thermal process can be adjusted.

For example, when the portion to be thermally processed 130 includes a $Si_xGe_{1-x}$ crystal ($0 \leq x < 1$) and the portion to be thermally processed 130 is annealed by continuous annealing using continuous light, the temperature of the thermal process is set at 850° C. to 900° C. and the duration of the thermal process is set at 2 to 10 minutes. The temperature for the annealing is, for example, set lower than the melting point of the portion to be thermally processed 130.

To perform flash annealing, for example, a lamp having a dose of 5 J/cm² is used to apply a flash having a wide emission spectrum with a wavelength range of 0.2 μm to 1.5 μm in approximately five pulses with the width of the pulse being set at 1 ms and the interval between the pulses being set at 30 s. This accumulates to application for a duration of approximately 5 ms and can bring the maximum reachable temperature of the portion to be thermally processed 130 to a temperature of 750° C. and 800° C.

Alternatively, the base wafer 1280 may be preheated in advance to a temperature of approximately 400° C. and 600° C., a lamp having a dose of 5 J/cm² may be similarly used to apply a flash having a similar wavelength range in approximately five pulses with the width of the pulse being set at 5 ms and the interval between the pulses being set at 30 s. This can bring the maximum reachable temperature of the portion to be thermally processed 130 to a temperature of 850° C. to 900° C.

The base wafer 1280 may be subjected to multi-stage annealing. For example, the base wafer 1280 may be first subjected to high-temperature annealing at a temperature that is lower than the melting point of the portion to be thermally processed 130, and then subjected to low-temperature annealing at a temperature lower than the temperature of the high-temperature annealing. In addition, the above-mentioned two-stage annealing may be repeatedly performed multiple times. For example, the temperature of the high-temperature annealing is set at 850° C. to 900° C. and the duration of the high-temperature annealing is set at 2 to 10 minutes when the portion to be thermally processed 130 includes a $Si_xGe_{1-x}$ crystal ($0 \leq x < 1$). On the other hand, the temperature of the low-temperature annealing is set at 600° C. to 780° C. and the duration of the low-temperature annealing is set at 2 to 10 minutes, for example.

When the portion to be thermally processed 130 is annealed by flash annealing, the above-described multi-stage annealing can be realized by adjusting the conditions of the flash annealing, such as the pulse width and the pulse duration. For example, when the two-stage annealing is realized in accordance with the flash-annealing scheme, the conditions such as the pulse width are adjusted such that the first flash causes the maximum reachable temperature of the portion to be thermally processed 130 to fall within the temperature range of the high-temperature annealing. Here, the temperature of the portion to be thermally processed 130 falls between the first flash and the next flash. Therefore, the pulse interval may be adjusted such that the next flash causes the temperature of the portion to be thermally processed 130 to fail within the temperature range of the low-temperature annealing.

The reflector 1234 reflects, among the electromagnetic waves applied from the lamps 1232, the electromagnetic waves that do not travel towards the base wafer 1280, toward the base wafer 1280. The power supply 1238 adjusts the currents supplied to the lamps 1232, fir example, based on the signal received from the controller 1260.

The filter 1236 is positioned between the base wafer 1280 and the lamps 1232. The filter 1236 may at least partially block the wavelength components of an electromagnetic wave, the wavelength components being capable of being absorbed by the base wafer 1280. The filter 1236 absorbs specific wavelength components, among the wavelength components of the electromagnetic wave generated by the lamps 1232. For example, among the wavelength components of the electromagnetic wave applied from the lamps 1232, the filter 1236 blocks the wavelength components at which a region of the base wafer 1280, the region being other than the portion to be thermally processed 130, is higher in absorption coefficient than the portion to be thermally processed 130 of the base wafer 1280.

When the base wafer 1280 has a to-be-protected portion, the filter 1236 may include the same material as the to-be-protected portion. For example, when the to-be-protected portion is a MOSFET formed in a Si crystal of a Si wafer, an SOI wafer or the like, a filter including a Si crystal, for example, a Si crystal wafer, is used. In this way, the base wafer 1280 can be exposed to an electromagnetic wave that is not absorbed by the Si crystal but can selectively heat a $Si_xGe_{1-x}$ crystal ($0 \leq x < 1$). As an alternative example, a Si crystal wafer having an $SiO_2$ layer formed thereon may be used as the filter. In this case, the base wafer 1280 can be exposed to an electromagnetic wave that is absorbed neither by the Si crystal nor by $SiO_2$ and can selectively heat a $Si_xGe_{1-x}$ crystal ($0 \leq x < 1$).

When the thermal process apparatus 1200 anneals the portion to be thermally processed 130 including a $Si_xGe_{1-x}$ crystal in accordance with the flash annealing scheme, a heating section may be used to preheat the entire base wafer 1280 in advance to a temperature of approximately 400° C. to 600° C. After preheating the base wafer 1280 from the side of the second main plane 1284, the thermal process apparatus 1200 may apply an electromagnetic wave to the base wafer 1280 from the side of the first main plane 1282 while maintaining the temperature of the entire base wafer 1280 at a prescribed temperature.

The thermal process apparatus 1200 may beat the base wafer 1280 in such a manner that the amount of the heat applied to the entire base wafer 1280 by the heat source positioned below the base wafer 1280 is substantially equal to the amount of the heat emitted from the base wafer 1280. The thermal process apparatus 1200 can reduce the pulse amplitude of the electromagnetic wave by preheating the base wafer 1280.

The preheating is performed to such an extent that the temperature of the region other than the portion to be thermally processed 130 does not exceed the temperature at which the region other than the portion to be thermally processed 130 is thermally deteriorated. Here, the temperature at which the region other than the portion to be thermally processed 130 is thermally deteriorated is defined as the temperature at which the characteristics of the region other than the portion to be thermally processed 130 go beyond a designed acceptable range.

The preheating can be realized, for example, by heating, to a prescribed temperature, a support that supports the base wafer 1280 within the reaction chamber. For example, the support, which has been heated to a prescribed temperature, is brought into contact with the second main plane 1284 of the base wafer 1280, so that the base wafer 1280 is preheated through the thermal conduction from the support to the base wafer 1280. The support is heated, for example, by applying an electromagnetic wave that is capable of being absorbed by the support to the first main plane 1282. Alternatively, the support may be electrothermally heated by heater or the like. Referring to the preheating, the base wafer 1280 may be heated by applying an electromagnetic wave that is capable of being absorbed by the base wafer 1280 from the side of the second main plane 1284.

The lamp unit 1240 is positioned so as to face the second main plane 1284 of the base wafer 1280. The lamp unit 1240 applies an electromagnetic wave to the base wafer 1280 from the side of the second main plane 1284 of the base wafer 1280. In this manner, the lamp unit 1240 can beat the support 1224.

In addition, the lamp unit 1240 can beat the entire base wafer 1280 through the support 1224. The base wafer 1280 is heated, for example, through heat transfer from the support 1224.

Each lamp 1242 generates an electromagnetic wave. Each lamp 1242 generates, for example, fight including infrared light. Each lamp 1242 may generate incoherent light. Thus, by arranging a large number of low-cost lamps 1242 in parallel, the base wafer 1280 having a large area can be thermally processed by a single operation. The lamps 1242 are each, for example, a high-intensity discharge lamp, a halogen lamp, a xenon lamp, or an LED lamp. The high-intensity discharge lamp is, for example, a high-pressure mercury lamp, a metal halide lamp, or a sodium lamp. It should be noted that the heating section is not limited to the lamp unit 1240. The heating section may wholly heat the support 1224 or the base wafer 1280 by means of resistance heating.

The thermal process apparatus 1200 may apply an electromagnetic wave using the lamps 1232 from above the base wafer 1280, while applying an electromagnetic wave using the lamp unit 1240. Keeping applying an electromagnetic wave using the lamp unit 1240, the thermal process apparatus 1200 can beat the portion to be thermally processed 130 while keeping the temperature of the back plane of the base wafer 1280 within a prescribed temperature range. This consequently facilitates the temperature control of the portion to be thermally processed 130.

The reflector 1244 reflects, among the electromagnetic waves applied from the lamps 1242, the electromagnetic waves that do not travel towards the base wafer 1280, toward the base wafer 1280. The power supply 1248 adjusts the currents supplied to the lamps 1242, for example, based on the signal received from the controller 1260.

The radiation thermometer 1252 measures the temperature of the base wafer 1280. The radiation thermometer 1252 measures the temperature of the portion to be thermally processed 130 or the absorptive layer 150 when the portion to be thermally processed 130 or the absorptive layer 150, which is adapted to be heated by the electromagnetic wave applied from the lamp unit 1230, is formed in the vicinity of the surface of the base wafer 1280. Thus, the temperature of the portion to be thermally processed 130 or the absorptive layer 150 can be measured in a contactless manner.

The radiation thermometer 1252 may measure the temperature of the base wafer 1280 or the like while the lamp unit 1230 is not applying an electromagnetic wave. In this way, the temperature of the base wafer 1280 or the like can be more accurately measured. The radiation thermometer 1252 may measure the temperature of the base wafer 1280 or the like immediately after the lamps 1232 go off.

The controller 1260 controls the lamp units 1230 and 1240 to adjust the temperature of the base wafer 1280. For example, the controller 1260 controls the current or the voltage supplied by the power supply 1238 to the lamps 1232 and the current or the voltage supplied by the power supply 1248 to the lamps 1242. The controller 1260 may control the lamp unit 1230 to apply an electromagnetic wave that has been pulsed to the base wafer 1280 after controlling the lamp unit 1240 to preheat the base wafer 1280 by continuously applying an electromagnetic wave to the support 1224.

The controller 1260 may control the lamp unit 1230 and the lamp unit 1240 independently from each other. The controller 1260 may control the outputs of the electromagnetic waves from the lamp units 1230 and 1240. For example, the controller 1260 controls how the lamp units 1230 and 1240 blink, how often they blink, the intensities of the generated electromagnetic waves, the average outputs, and the total doses of the applications over a prescribed duration, and other parameters.

In order that the lamp unit 1230 applies an electromagnetic wave that has been pulsed, the controller 1260 may control the lamp unit 1230 to establish an application period during which the lamp unit 1230 applies an electromagnetic wave and a non-application period during which the lamp unit 1230 does not apply an electromagnetic wave. Alternatively, in order that the lamp unit 1230 applies an electromagnetic wave that has been pulsed, the controller 1260 may control the lamp unit 1230 to establish a period during which the lamp unit 1230 applies an electromagnetic wave having a high output and a period during which the lamp unit 1230 applies an electromagnetic wave having a lower output than the above-mentioned electromagnetic wave.

The controller 1260 may control the output of the lamp unit 1240 based on the temperature of the support 1224, the temperature being measured by the temperature sensor disposed on the support 1224. The controller 1260 may control the output of the lamp unit 1230 based on the temperature measured by the radiation thermometer 1252. For example, the controller 1260 adjusts the intensity of the electromagnetic wave to be applied by the lamp unit 1230, based on the temperature of the portion to be thermally processed 130, the temperature being measured by the radiation thermometer 1252. For example, using the radiation thermometer 1252, the controller 1260 measures the temperature of the base wafer 1280, the temperature of the portion to be thermally processed 130, the temperature of the absorptive layer 150 and other temperatures during the non-application period of the lamp unit 1230. The controller 1260 may consider the temperature of the absorptive layer 150 as the temperature of the portion to be thermally processed 130.

When the measured temperature of the portion to be thermally processed 130 does not reach the temperature necessary for annealing, the controller 1260 may increase the width of the pulse output from the lamp unit 1230 to raise the temperature of the portion to be thermally processed 130. The controller 1260 may raise the temperature of the portion to be thermally processed 130 by increasing the duration of the application made by the lamp unit 1230.

The controller 1260 may determine an application period during which the lamp unit 1230 applies an electromagnetic wave and a non-application period during which the lamp unit 1230 does not apply an electromagnetic wave, based on the result of the measurement done by the temperature sensor. Here, the temperature sensor serves as a heating temperature measuring section, and the lamp unit 1230 serves as an applying section. Specifically speaking, the controller 1260 controls the amount of the heat to be applied by the lamp unit 1230, based on the temperature of the back plane of the base wafer 1280, the temperature being measured by the temperature sensor. For example, when the temperature of the back plane of the base wafer 1280 is 300° C., the controller 1260 sets the application period of the lamp unit 1230 longer than when the temperature of the back plane of the base wafer 1280 is 400° C. In this manner, the temperature of the portion to be thermally processed 130 can rise to the temperature necessary for annealing within a short period of time.

As discussed above, the thermal process apparatus 1200 can selectively heat the portion to be thermally processed 130 by applying an electromagnetic wave to thermally process the base wafer 1280 having the portion to be thermally processed 130 and the absorptive layer 150. This can reduce the density of the defects within the crystal of the portion to be thermally processed 130.

Having the lamp unit 1230 that heats the base wafer 1280 from the side of the first main plane 1282 and the lamp unit 1240 that heats the base wafer 1280 from the side of the second main plane 1284, the thermal process apparatus 1200 can beat the base wafer 1280 from both sides. In addition, the thermal process apparatus 1200 can control the lamp units 1230 and 1240 independently from each other and can thus heat the base wafer 1280 from the respective sides independently from each other. As a consequence, the thermal process apparatus 1200 can control the temperature of the base wafer 1280 in various manners.

In place of the base wafer 1280, the thermal process apparatus 1200 may hold, within the reaction chamber, an SOI wafer or a Si wafer on which a semiconductor device is at least partially formed, and a wafer on which a portion to be thermally processed including a $Si_xGe_{1-x}$ crystal ($0 \leq x < 1$) is provided. In this case, the electromagnetic wave applying section may apply, to the wafer, an electromagnetic wave for which the absorption coefficient of the $Si_xGe_{1-x}$ crystal is higher than the absorption coefficient of the Si included in the SOI wafer or the Si wafer.

Figure 13:
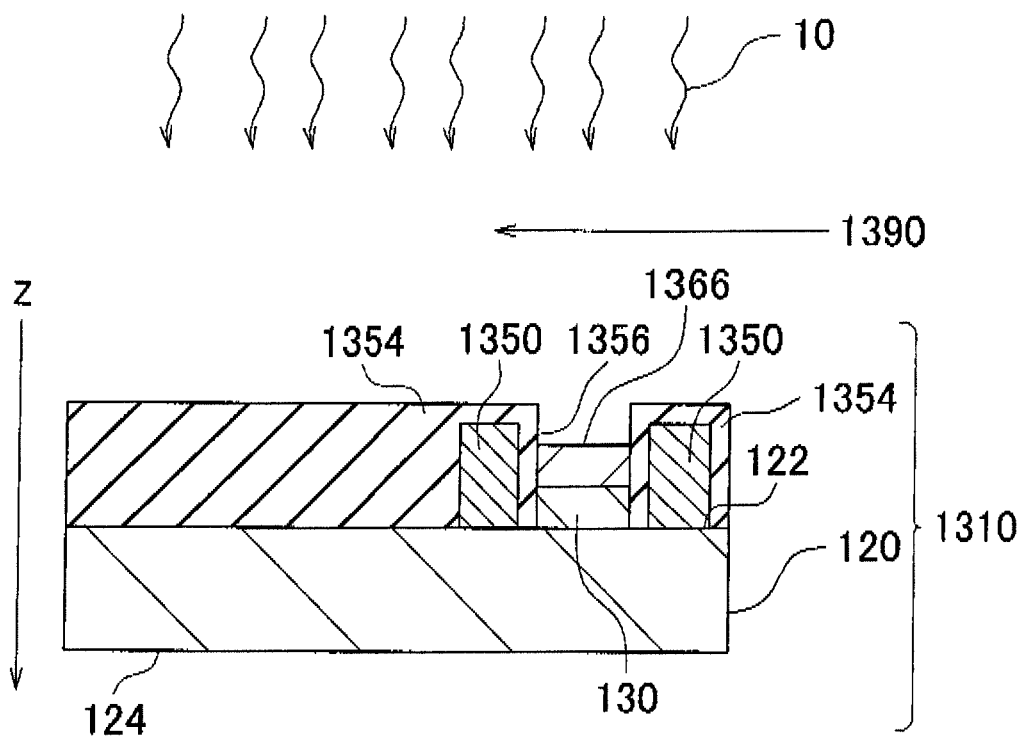
FIG. 13 schematically illustrates an exemplary cross-section of a semiconductor wafer 1310.

FIG. 13 schematically illustrates an exemplary cross-section of a semiconductor wafer 1310. FIG. 13 is used to illustrate epitaxial growth of a group III-V compound semiconductor 1366 on the surface of the portion to be thermally processed 130. The group III-V compound semiconductor 1366 may be shown as an exemplary group III-V compound semiconductor.

The semiconductor wafer 1310 includes the base wafer 120, an inhibition layer 1354 formed on the base wafer 120 and having therein an opening 1356, the portion to be thermally processed 130 formed within the opening 1356, an absorptive layer 1350 provided in the vicinity of the portion to be thermally processed 130, and a group III-V compound semiconductor 1366. The absorptive layer 1350 is equivalent to the absorptive layer 250 shown in FIG. 2. The inhibition layer 1354 is equivalent to the inhibition layer 554 shown in FIG. 2.

The inhibition layer 1354 is at least partially positioned between the absorptive layer 1350 and the portion to be thermally processed 130, which serves as a seed crystal. Stated differently, the semiconductor wafer 1310 is different from the semiconductor wafer 210 or the semiconductor wafer 910 in that the absorptive layer 1350 is provided within the inhibition layer 1354. In the present embodiment, the group III-V compound semiconductor 1366 can be formed, for example, in the following manner.

To begin with, the base wafer 120 on which the absorptive layer 1350 and the inhibition layer 1354 are formed is provided and held within the reaction chamber. After this, the opening 1356 is formed in the inhibition layer 1354 by etching or the like to externally expose the first main plane 122 of the base wafer 120. The opening 1356 is (brined so as to be surrounded by the absorptive layer 1350. Subsequently, the portion to be thermally processed 130 is formed within the opening by CVD or the like. The portion to be thermally processed 130 is, for example, a $Si_xGe_{1-x}$ crystal ($0 \leq x < 1$).

After this, while the electromagnetic wave 10 that is capable of being absorbed by the absorptive layer 1350 is applied to the entire first main plane 122 of the base wafer 120, a source gas 1390 is supplied to the reaction chamber. The electromagnetic wave 10 preferably has a wavelength that is unlikely to be absorbed by the inhibition layer 1354. When the electromagnetic wave 10 is applied toward the first main plane 122 of the base wafer 120, the absorptive layer 1350 is selectively heated, and the heat generated by the absorptive layer 1350 heats the portion to be thermally processed 130. Since crystal growth is inhibited on the surface of the inhibition layer 1354, the group III-V compound semiconductor 1366 is selectively epitaxially grown on the surface of the portion to be thermally processed 130. Here, for example, the electromagnetic wave 10 is applied toward the first main plane 122 of the base wafer 120 while the entire semiconductor wafer 1310 is heated from the side of the second main plane 124.

The portion to be thermally processed 130 is preferably annealed prior to the step of epitaxially growing the group III-V compound semiconductor 1366. Here, the annealing of the portion to be thermally processed 130 may be performed within the same reaction chamber as the epitaxial growth of the group III-V compound semiconductor 1366. Furthermore, the epitaxial growth of the group III-V compound semiconductor 1366 may be performed successively after the annealing of the portion to be thermally processed 130 without exposing the semiconductor wafer 110 to air between the annealing and the epitaxial growth.

The method for selectively epitaxially growing the group III-V compound semiconductor 1366 is not limited to the above-described method. The source gas may be supplied to the reaction chamber while an electromagnetic wave is applied to a wafer including a portion to be thermally processed, a to-be-protected portion that is disposed in at least a part of a portion other than the portion to be thermally processed, and a protective layer that protects the to-be-protected portion from the electromagnetic wave.

Figure 14:
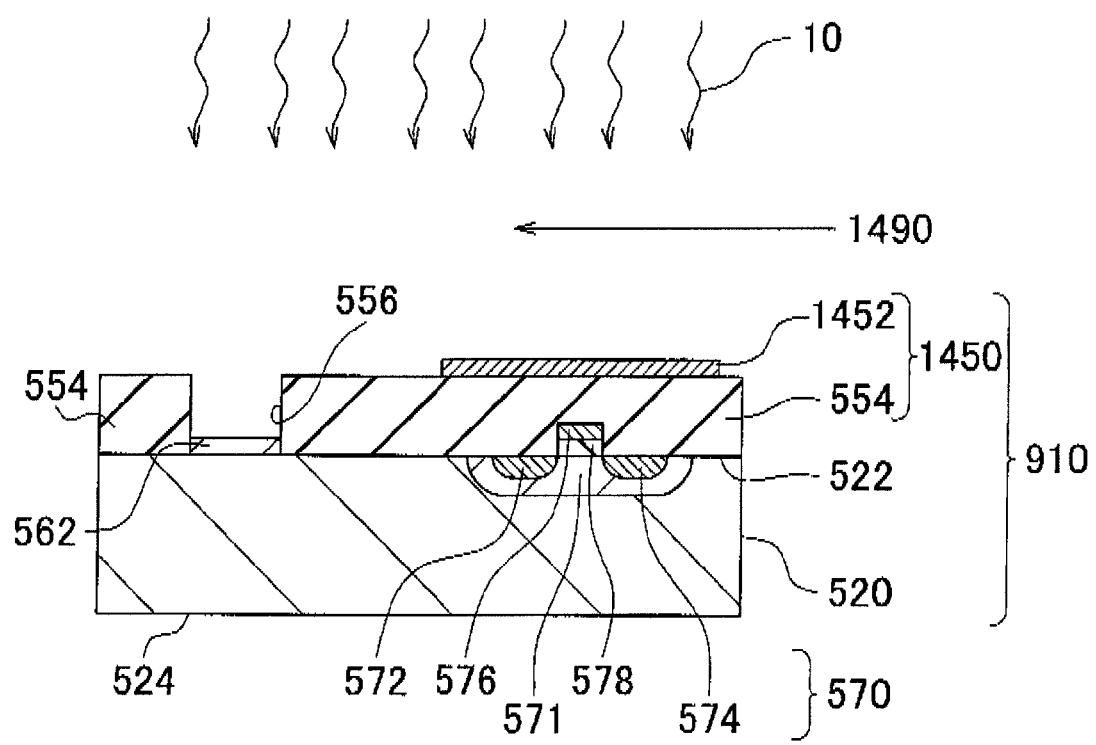
FIG. 14 schematically illustrates the exemplary semiconductor wafer 910 observed during the production process of the semiconductor wafer 510.

FIG. 14 schematically illustrates the exemplary semiconductor wafer 910 observed during the production process of the semiconductor wafer 510. The semiconductor wafer 910 has the crystal 562, which is obtained by heating the $Si_xGe_{1-x}$ crystal 962.

In the present embodiment, the semiconductor wafer 910 has a protective layer 1450 that protects the first electronic element 570 from the electromagnetic wave 10. The protective layer 1450 includes a block layer 1452 that at least partially blocks the electromagnetic wave 10 and the inhibition layer 554. The block layer 1452 is arranged on the inhibition layer 554. The block layer 1452 is, for example, a metal thin film made of W, Al or the like. Thus, the block layer 1452 can reflect at least a part of the electromagnetic wave 10. Since the inhibition layer 554 is positioned between the block layer 1452 and the first electronic element 570, the heat generated by the block layer can be prevented from being directly transferred to the first electronic element 570.

The group III-V compound semiconductor 566 can be formed, for example, in the Following manner. To begin with, the semiconductor wafer 910, which has the $Si_xGe_{1-x}$ crystal 562 formed thereon, is held within a reaction chamber of a CVD apparatus or the like. The thermal process apparatus used to beat the $Si_xGe_{1-x}$ crystal 962 may also serve as the CVD apparatus. After this, while the electromagnetic wave 10 that is capable of being absorbed by the $Si_xGe_{1-x}$ crystal 562 is applied to the entire semiconductor wafer 910, a source gas 1490 is supplied to the reaction chamber. The wavelength of the electromagnetic wave 10 is preferably selected such that the electromagnetic wave 10 is unlikely to be absorbed by the inhibition layer 554 and likely to be blocked by the block layer 1452.

The electromagnetic wave 10 applied to the semiconductor wafer 910 selectively heats the $Si_xGe_{1-x}$ crystal 562, so that the group III-V compound semiconductor 566 is selectively epitaxially grown on the surface of the heated $Si_xGe_{1-x}$ crystal 562. Here, the electromagnetic wave 10 may be applied to the semiconductor wafer 910 while the entire semiconductor wafer 910 is heated from the side of the second main plane 524.

In the present embodiment, the case where the source gas 1490 is supplied to the reaction chamber while the electromagnetic wave 10 is applied to the semiconductor wafer 910 having the $Si_xGe_{1-x}$ crystal 562 and the protective layer 1450 has been explained. However, the method for selectively epitaxially growing the group III-V compound semiconductor 566 is not limited to this method. As described in connection with FIG. 13, the source gas 1490 may be supplied to the reaction chamber while the $Si_xGe_{1-x}$ crystal 562 is selectively heated by the absorptive layer, which is positioned, within the inhibition layer 554, in the vicinity of the $Si_xGe_{1-x}$ crystal 562. The semiconductor wafer 910 may include the above-described absorptive layer and the protective layer 1450.

EXEMPLARY EMBODIMENTS

Exemplary Embodiment 1

The electronic device 500 was produced in accordance with the procedure shown in FIG. 6. As the base wafer 520, a commercially available SOI wafer was provided. As the first electronic element 570, which is shown as an exemplary to-be-protected portion, a MOSFFT was formed in the Si crystal layer of the base wafer 520. As the inhibition layer 554, a $SiO_2$ layer in contact with the first main plane 522 or the base wafer 520 was Conned by CVD. The average thickness of the $SiO_2$ layer was 1 µm. The opening 556 was formed in a part or the inhibition layer 554 by photolithography. The opening 556 had a size of 15 µm×15 µm.

The base wafer 520 on which the inhibition layer 554 and the opening 556 had been formed was arranged within the thermal process furnace 1210 of the thermal process apparatus 1200 to form a Ge crystal layer as the $Si_xGe_{1-x}$ crystal 962. The base wafer 520 was placed on the upper plane of the support 1224 in such a manner that the second main plane 524 of the base wafer 520 came into contact with the support 1224. The support 1224 was a graphite susceptor. The Ge crystal layer was selectively formed within the opening 556 by CVD. The Ge crystal layer was first deposited until the thickness became approximately 20 nm using $GeH_4$ as the source gas with the pressure within the thermal process furnace 1210 being set at 2.6 kPa and the temperature being set at 400° C. After this, the temperature was raised to 600° C., and the Ge crystal layer was further deposited until the thickness became approximately 1 µm. In the above-described steps, the semiconductor wafer 910 was produced.

On the surface of the inhibition layer 554, a structure constituted by an Ag thin film and a $SiO_2$ layer was formed as a block layer. This structure was formed in the following manner. The Ag thin film was formed in advance on the surface of the inhibition layer 554 by vacuum evaporation. Furthermore, alter the $SiO_2$ layer having the thickness of 100 nm was deposited as an Ag protecting layer by vacuum evaporation on the surface of the Ag thin film, the Ag thin film and the $SiO_2$ layer, which served as the Ag protecting layer, were patterned by photolithography. In this way, the structure was obtained. The Ag thin film and the $SiO_2$ layer, which served as the Ag protecting layer, were patterned to be sized so as to cover and hide the first electronic element 570 when seen in the perpendicular direction to the first main plane 522.

Subsequently, within the thermal process furnace 1210, the lamp unit 1240 applied an infrared ray toward the hack plane of the support 1224, on which the semiconductor wafer 910 was placed. In this manner, the support 1224 was heated. By means of the thermal conduction from the support 1224 to the second main plane 524 of the semiconductor wafer 910, the semiconductor wafer 910 was preheated. The preheating was performed to such an extent that the temperature of the support 1224 became 400° C. Here, the temperature of approximately 400° C. was also observed in the vicinity of the $Si_xGe_{1-x}$ crystal 962 and in the vicinity of the first electronic element 570.

The temperatures were measured using an infrared surface thermometer. After the temperature of the semiconductor wafer 910 was stabilized by the preheating, while the lamp unit 1240 was heating the entire semiconductor wafer 910, the lamp unit 1230 applied lamp light including an infrared ray to the semiconductor wafer 910 from the side of the first main plane 522 with the inhibition layer 554 and the block layer being used as the protective layer. The wavelength of the lamp light was selected such that the lamp light is more likely to be absorbed by the $Si_xGe_{1-x}$ crystal than by the Si crystal. In this way, the $Si_xGe_{1-x}$ crystal 962 was selectively heated and thus annealed.

After the $Si_xGe_{1-x}$ crystal 962 was formed, the semiconductor wafer 910 was not taken out of the thermal process furnace 1210 before the application of the lamp light started. Stated differently, in the present exemplary embodiment, after the step of growing the precursors of the $Si_xGe_{1-x}$ crystal 962 into a crystal, the step of selectively heating the $Si_xGe_{1-x}$ crystal 962 was successively performed without exposing the $Si_xGe_{1-x}$ crystal 962 to air between the steps. In addition, the step of growing the precursors of the $Si_xGe_{1-x}$ crystal 962 into a crystal was performed within the same reaction chamber as the step of selectively heating the $Si_xGe_{1-x}$ crystal 962.

The above-mentioned lamp light including an infrared ray was emitted from a light source using 20 halogen lamps each having the maximum output of 1.6 kW (available from USHIO INC.). The outputs of the halogen lamps were adjusted in the following manner. To start with, a reference wafer was provided in which a Ge single-crystal layer having the thickness of approximately 1 µm was formed on the entire plane of a Si wafer. Using the reference wafer, the correlation characteristics between the outputs of the halogen lamps and the surface temperature of the reference wafer were obtained. Based on the obtained correlation characteristics, the outputs of the halogen lamps were set so that the surface temperature of the first main plane 522 of the semiconductor wafer 910 became 850° C., and the lamp light was applied to the semiconductor wafer 910 for 20 minutes. Between the halogen lamps and the semiconductor wafer 910, a Si single-crystal plate was disposed as the filter 1236. Thus, the light that had transmitted through the Si single-crystal plate was applied to the first main plane 522 of the semiconductor wafer 910.

The correlation characteristics between the outputs of the halogen lamps and the surface temperature of the reference wafer were obtained in the following manner. To start with, the reference wafer was placed on the support 1224 within the thermal process furnace 1210. The reference wafer was placed in such a manner that the plane (may be referred to as a second main plane) that faced away from the plane on which the Ge single-crystal layer was formed (may be referred to as a first main plane) came into contact with the upper plane of the support 1224.

After this, the reference wafer was preheated. The preheating was performed in such a manner that, within the thermal process furnace 1210, the an infrared ray was applied to the support 1224 from the side of the lower plane to beat the support 1224. By means of the thermal conduction from the support 1224 to the reference wafer, the entire reference wafer was heated. The preheating was performed to such an extent that the temperature of the support 1224 became 400° C. Here, calibration of the infrared surface thermometer was also carried out. According to the calibration, the setting of the infrared surface thermometer was adjusted such that the infrared surface thermometer read approximately 400° C. when measuring the surface temperature of the first main plane of the reference wafer.

After the temperature of the reference wafer was stabilized by the preheating, the lamp light including an infrared ray was applied to the reference wafer from the side of the first main plane of the reference wafer intermittently at intervals of approximately 10 seconds. By measuring the surface temperature of the first main plane immediately after the lamp light went off with the infrared surface thermometer, the correlation characteristics between the outputs of the halogen lamps that were applied from the side of the first main plane and the surface temperature of the first main plane of the reference wafer were obtained.

While the lamp light was applied to the semiconductor wafer 910 and the reference wafer, the temperature of the support 1224 was adjusted in such a manner that a thermocouple embedded within the support 1224 was used to detect the temperature of the support 1224 and the energy of the infrared ray applied to the lower plane of the support 1224 was feedback-controlled. The energy of the infrared ray was adjusted so that the temperature of the support 1224 became 400° C.

As described above, after the $Si_xGe_{1-x}$ crystal 962 of the semiconductor wafer 910 was annealed, a GaAs layer was formed by MOCVD as the group III-V compound semiconductor 566 without removing the semiconductor wafer 910 from the thermal process furnace 1210 between the annealing and the GaAs layer formation. The GaAs layer was deposited using trimethyl gallium and arsine as the source gases with the temperature being set at 650° C. and the pressure within the thermal process furnace 1210 being set at 9.9 kPa. The GaAs layer was formed by supplying the source gases into the thermal process furnace 1210 while the electromagnetic wave that was capable of being absorbed by the $Si_xGe_{1-x}$ crystal 562, which was obtained as a result of the annealing, was applied to the semiconductor wafer 910. The GaAs layer was formed while the lamp unit 1240 was heating the entire semiconductor wafer 910. Here, the temperature of the graphite support was adjusted to become 400° C. After this, the outermost $SiO_2$ layer, which served as the Ag protecting layer, and the Ag thin film were removed by etching. As a result, the semiconductor wafer 510 was produced.

As the second electronic element 580, a HBT whose active layer was formed by the GaAs layer was formed. After this, interconnections were formed. As a result, the electronic device 500 was produced. An operational test performed on the electronic device 500 confirmed that the electronic device 500 showed a current gain of 175 for a collector current density of 1 kA/cm². Thus, the electronic device 500 was confirmed that it could operate normally as a current amplifying element. The MOSFET, which was formed in the Si crystal layer of the base wafer 520 as the first electronic element 570, was confirmed that the threshold value and the current-voltage characteristics remained unchanged from the initial characteristics.

Furthermore, observation of the annealed Ge crystal layer using an SEM revealed that the Ge crystal layer had the thickness of approximately 1 μm and the GaAs layer had the thickness of 2.5 μm as designed. Examination of the surface of the GaAs layer using the etch-pit method found no defects on the surface or the GaAs layer. In-plane cross-sectional observation using a TEM found no dislocations that penetrated through the Ge crystal layer and the GaAs layer.

Exemplary Embodiment 2

The electronic device 500 was produced in accordance with the procedure shown in FIG. 6. As in Exemplary Embodiment 1, the inhibition layer 554 and the opening 556 were formed on the base wafer 520. The base wafer 520 was arranged within the thermal process furnace 1210 to form a Ge crystal layer as the $Si_xGe_{1-x}$ crystal 962. The Ge crystal layer was selectively formed within the opening 556 by CVD. The Ge crystal layer was first deposited until the thickness became approximately 20 nm using $GeH_4$ as the source gas with the pressure within the thermal process furnace 1210 being set at 2.6 kPa and the temperature being set at 400° C. After this, the temperature was raised to 600° C., and the Ge crystal layer was further deposited until the thickness became approximately 1 μm. By performing the above-described steps, the semiconductor wafer 910 was produced. Here, on the surface of the inhibition layer 554, the block layer was formed as in Exemplary embodiment 1.

Subsequently, the semiconductor wafer 910 was taken out of the thermal process furnace 1210, and placed on a graphite support that is positioned within a different reaction chamber in such a manner that the second main plane 524 of the base wafer 520 came into contact with the graphite support. Within this different reaction chamber, the graphite support was thermoelectrically heated from the side of the back plane of the graphite support on which the semiconductor wafer 910 was placed. As a result, the semiconductor wafer 910 was preheated by means of the thermal conduction to the second main plane 524 of the semiconductor wafer 910, the second main plane 524 being in contact with the graphite support. The preheating was performed to such an extent that the temperature of the graphite support reached 200° C. to 600° C.

After the temperature of the semiconductor wafer 910 was stabilized by the preheating, while the lamp unit 1240 was heating the entire semiconductor wafer 910, a flash was applied to the semiconductor wafer 910 from the side of the first main plane 522 under an inert gas atmosphere of $N_2$ or Ar with the inhibition layer 554 and the block layer being used as the protective layer. In this way, the $Si_xGe_{1-x}$ crystal 962 was selectively heated and thus annealed.

As the flash lamp, a xenon lamp whose input energy per unit area of the semiconductor wafer 910 reached approximately 15 J/cm² (available from USHIO INC.) was used. The flash was applied in five pulses with the pulse width being set at 1 ms and the interval between the pulses being set at 30 s. Here, the temperature of the graphite support was adjusted to become equal to 400° C. Between the flash lamp and the semiconductor wafer 910, a Si single-crystal plate was disposed as the filter 1236. Thus, the light that had transmitted through the Si single-crystal plate was applied to the first main plane 522 of the semiconductor wafer 910.

As described above, after the $Si_xGe_{1-x}$ crystal 962 of the semiconductor wafer 910 was annealed, the semiconductor wafer 910 was taken out of the reaction chamber in which the thermal process was performed. After this, using a different reaction chamber, a GaAs layer was formed by MOCVD as the group III-V compound semiconductor 566. The GaAs layer was deposited using trimethyl gallium and arsine as the source gases with the temperature being set at 650° C. and the pressure within the reaction chamber being set at 9.9 kPa. The GaAs layer was formed by supplying the source gases into the thermal process furnace 1210 while the electromagnetic wave that was capable of being absorbed by the $Si_xGe_{1-x}$ crystal 562, which was obtained as a result of the annealing, was applied to the semiconductor wafer 910. The GaAs layer was formed while the lamp unit 1240 was heating the entire semiconductor wafer 910. Here, the temperature of the graphite support was adjusted to become 400° C. After this, the outermost $SiO_2$ layer, which served as the Ag protecting layer, and the Ag thin film were removed by etching. As a result, the semiconductor wafer 510 was produced.

As the second electronic element 580, a HBT whose active layer was formed by the GaAs layer was formed. After this, interconnections were formed. As a result, the electronic device 500 was produced. An operational test performed on the electronic device 500 confirmed that the electronic device 500 showed a current gain of 178 for a collector current density of 1 $kA/cm^2$. Thus, the electronic device 500 was confirmed that it could operate normally as a current amplifying element. The MOSFET, which was formed in the Si crystal layer of the base wafer 520 as the first electronic element 570, was confirmed that the threshold value and the current-voltage characteristics remained unchanged from the initial characteristics.

Furthermore, observation of the annealed Ge crystal layer using an SEM revealed that the Ge crystal layer had the thickness of approximately 1 μm and the GaAs layer had the thickness of approximately 2.5 μm as designed. Examination of the surface of the GaAs layer using the etch-pit method found no defects on the surface of the GaAs layer. In-plane cross-sectional observation using a TEM found no dislocations that penetrated through the Ge crystal layer and the GaAs layer.

Exemplary Embodiment 3

The electronic device 500 was produced in accordance with the procedure shown in FIG. 6. As in Exemplary Embodiment 1, the base wafer 520 was provided on which the inhibition layer 554 and the opening 556 were formed. The base wafer 520 was arranged within the thermal process furnace 1210 to form a Ge crystal layer as the $Si_xGe_{1-x}$ crystal 962. The Ge crystal layer was selectively formed within the opening 556 by CVD. The Ge crystal layer was first deposited until the thickness became approximately 20 nm using $GeH_4$ as the source gas with the pressure within the thermal process furnace 1210 being set at 2.6 kPa and the temperature being set at 400° C. After this, the temperature was raised to 600° C., and the Ge crystal layer was further deposited until the thickness became approximately 1 μm.

As the absorptive layer 950, an amorphous silicon layer was formed. The amorphous silicon layer was formed by CVD so as to be in contact with the $Si_xGe_{1-x}$ crystal 962 positioned within the opening 556. After this etching or the like was performed to remove the unnecessary portion of the amorphous silicon layer formed on the surface of the inhibition layer 554, the unnecessary portion being positioned above the first electronic element 570. In the above-described steps, the semiconductor wafer 910 was produced.

Subsequently, the semiconductor wafer 910 was taken out of the thermal process furnace 1210, and placed on a graphite support that is positioned within a different reaction chamber in such a manner that the second main plane 524 of the base wafer 520 came into contact with the graphite support. Within this different reaction chamber, the graphite support was thermoelectrically heated from the side of the back plane of the graphite support on which the semiconductor wafer 910 was placed. As a result, the semiconductor wafer 910 was preheated by means of the thermal conduction to the second main plane 524 of the semiconductor wafer 910, the second main plane 524 being in contact with the graphite support. The preheating was performed to such an extent that the temperature of the graphite support reached 200° C. to 600° C.

After the temperature of the semiconductor wafer 910 was stabilized by the preheating, a flash was applied from a flash lamp to the semiconductor wafer 910 from the side of the first main plane 522 under an inert gas atmosphere of $N_2$ or Ar with the inhibition layer 554 being used as the protective layer. Between the flash lamp and the semiconductor wafer 910, a filter that was designed to mainly transmit the visible wavelength components was disposed as the filter 1236. Thus, the light that had transmitted through the filter was applied to the first main plane 522 of the semiconductor wafer 910. In this manner, the absorptive layer 950 was selectively heated, and the heat transfer from the absorptive layer 950 then heated the $Si_xGe_{1-x}$ crystal 962. Accordingly, the $Si_xGe_{1-x}$ crystal 962 was annealed. Here, the temperature of the graphite support was adjusted to become equal to 400° C.

As described above, after the $Si_xGe_{1-x}$ crystal 962 of the semiconductor wafer 910 was annealed, the semiconductor wafer 910 was taken out of the reaction chamber in which the thermal process was performed. Following this, using a different reaction chamber, a GaAs layer was formed by MOCVD as the group III-V compound semiconductor 566 after the absorptive layer 950 was removed by etching. The GaAs layer was deposited using trimethyl gallium and arsine as the source gases with the temperature being set at 650° C. and the pressure within the reaction chamber being set at 9.9 kPa. In this manner, the semiconductor wafer 510 was produced.

As the second electronic element 580, a HBT whose active layer was formed by the GaAs layer was formed. After this, interconnections were formed. As a result, the electronic device 500 was produced. An operational test performed on the electronic device 500 confirmed that the electronic device 500 showed a current gain of 178 for a collector current density of 1 $kA/cm^2$. Thus, the electronic device 500 was confirmed that it could operate normally as a current amplifying element. The MOSFET, which was formed in the Si crystal layer of the base wafer 520 as the first electronic element 570, was confirmed that the threshold value and the current-voltage characteristics remained unchanged from the initial characteristics.

Furthermore, observation of the annealed Ge crystal layer using an SEM revealed that the Ge crystal layer had the thickness of approximately 1 μm and the GaAs layer had the thickness of approximately 2.5 μm as designed. Examination of the surface of the GaAs layer using the etch-pit method found no defects on the surface of the GaAs layer. In-plane cross-sectional observation using a TEM found no dislocations that penetrated through the Ge crystal layer and the GaAs layer.

Exemplary Embodiment 4

The electronic device 500 was produced in accordance with the procedure shown in FIG. 6. As the base wafer 520, a commercially available SOI wafer was provided. As the first electronic element 570, which was shown as an exemplary to-be-protected portion, a MOSFET was formed in the Si crystal layer of the base wafer 520. As the inhibition layer 554, a $SiO_2$ layer was formed by CVD in contact with the first main plane 522 of the base wafer 520. The $SiO_2$ layer had the thickness of 1 μm on average. In a part of the inhibition layer 554, the opening 556 was formed by photolithography. The opening 556 had a size of 15 μm×15 μm.

The base wafer 520 on which the inhibition layer 554 and the opening 556 had been formed was arranged within the thermal process furnace 1210 of the thermal process apparatus 1200 to form a Ge crystal layer as the $Si_xGe_{1-x}$ crystal 962. The base wafer 520 was placed on the upper plane of the support 1224 in such a manner that the second main plane 524 of the base wafer 520 came into contact with the support 1224. The support 1224 was a graphite susceptor. The Ge crystal layer was selectively formed within the opening 556 by CVD. The Ge crystal layer was first deposited until the thickness became approximately 20 nm using $GeH_4$ as the source gas with the pressure within the thermal process furnace 1210 being set at 2.6 kPa and the temperature being set at 400° C. After this, the temperature was raised to 600° C., and the Ge crystal layer was further deposited until the thickness became approximately 1 μm. In the above-described steps, the semiconductor wafer 910 was produced.

Subsequently, within the thermal process furnace 1210, the lamp unit 1240 applied an infrared ray toward the back plane of the support 1224, on which the semiconductor wafer 910 was placed. In this manner, the support 1224 was heated. By means of the thermal conduction from the support 1224 to the second main plane 524 of the semiconductor wafer 910, the semiconductor wafer 910 was preheated. The preheating was performed to such an extent that the temperature of the support 1224 became 400° C. Here, the temperature of approximately. 400° C. was also observed in the vicinity of the $Si_xGe_{1-x}$ crystal 962 and in the vicinity of the first electronic element 570. The temperatures were measured using an infrared surface thermometer. After the temperature of the semiconductor wafer 910 was stabilized by the preheating, while the lamp unit 1240 was heating the entire semiconductor wafer 910, the lamp unit 1230 applied lamp light including an infrared ray to the semiconductor wafer 910 from the side of the first main plane 522 of the semiconductor wafer 910 with the inhibition layer 554 being used as the protective layer. The wavelength of the lamp light was selected such that the lamp light is more likely to be absorbed by the $Si_xGe_{1-x}$ crystal than by the Si crystal. In this way, the $Si_xGe_{1-x}$ crystal 962 was selectively heated and thus annealed.

After the $Si_xGe_{1-x}$ crystal 962 was formed, the semiconductor wafer 910 was not taken out of the thermal process furnace 1210 before the application of the lamp light started. Stated differently, in the present exemplary embodiment, after the step of growing the precursors of the $Si_xGe_{1-x}$ crystal 962 into a crystal, the step of selectively heating the $Si_xGe_{1-x}$ crystal 962 was successively performed without exposing the $Si_xGe_{1-x}$ crystal 962 to air between the steps. In addition, the step of growing the precursors of the $Si_xGe_{1-x}$ crystal 962 into a crystal was performed within the same reaction chamber as the step of selectively heating the $Si_xGe_{1-x}$ crystal 962.

The above-mentioned lamp light including an infrared ray was emitted from a light source using 20 halogen lamps each having the maximum output of 1.6 kW (available from USHIO INC.). The outputs of the halogen lamps were adjusted in the following manner. To start with, a reference wafer was provided in which a Ge single-crystal layer having the thickness of approximately 1 μm was formed on the entire plane of a Si wafer. Using the reference wafer, the correlation characteristics between the outputs of the halogen lamps and the surface temperature of the reference wafer were obtained. Based on the obtained correlation characteristics, the outputs of the halogen lamps were set so that the surface temperature of the first main plane 522 of the semiconductor wafer 910 became 850° C., and the lamp light was directly applied to the semiconductor wafer 910 for 20 minutes. Between the halogen lamps and the semiconductor wafer 910, a Si single-crystal plate was disposed as the filter 1236. Thus, the light that had transmitted through the Si single-crystal plate was applied to the first main plane 522 of the semiconductor wafer 910. The semiconductor wafer 910 was then taken out of the reaction chamber.

Figure 15:
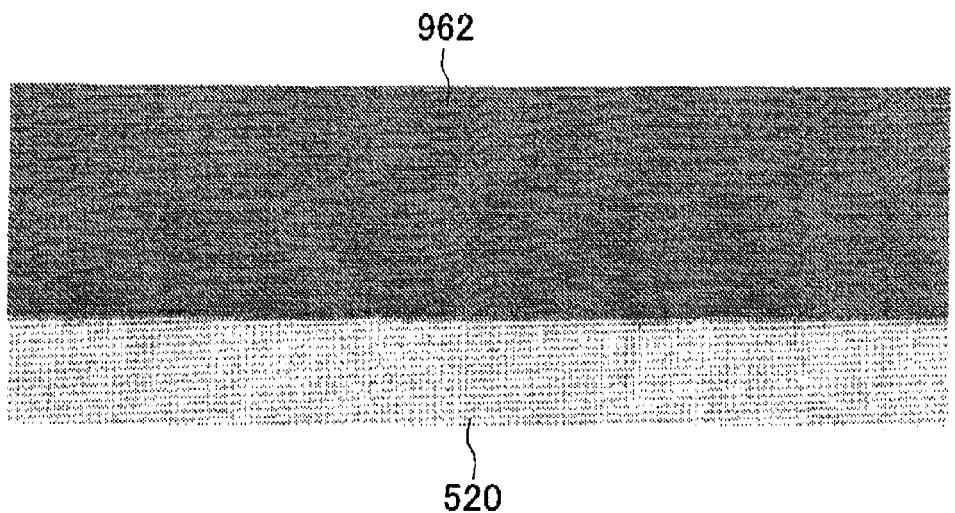
FIG. 15 is a TEM photograph showing the cross-section of the semiconductor wafer 910, which has been taken out of a reaction chamber.
Figure 16:
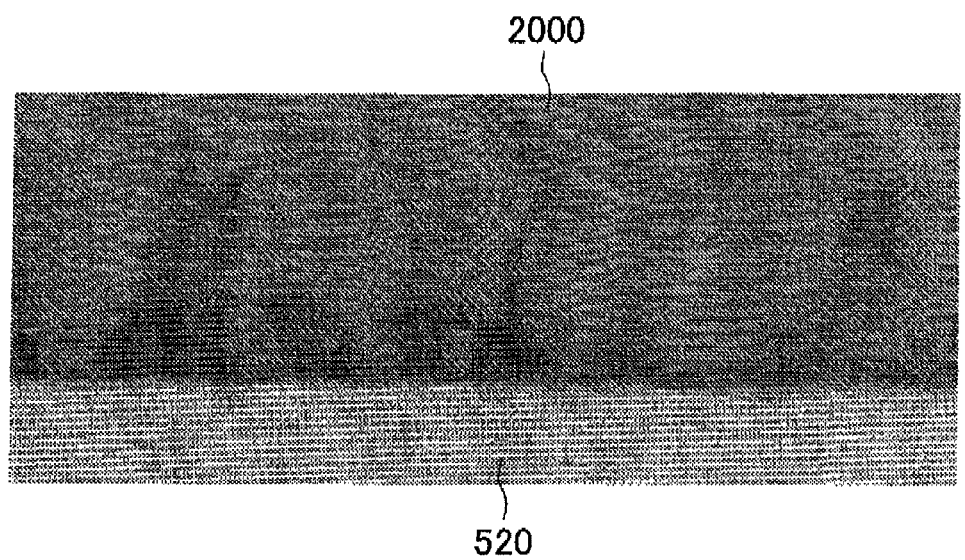
FIG. 16 is a TEM photograph showing the cross-section of the semiconductor wafer 910 including a $Si_xGe_{1-x}$ crystal 2000, which has not been thermally processed.

FIG. 15 is a TEM photograph showing the cross-section of the semiconductor wafer 910, which has been taken out of a reaction chamber. The boundary portion between the base wafer 520 and the $Si_xGe_{1-x}$ crystal 962 formed thereon was examined. FIG. 16 is a TEM photograph showing the cross-section of the semiconductor wafer 910 including a $Si_xGe_{1-x}$ crystal 2000, which has not been thermally processed. Unlike the $Si_xGe_{1-x}$ crystal 962, the $Si_xGe_{1-x}$ crystal 2000 shown in FIG. 16 is not annealed. Many dislocations were found in the $Si_xGe_{1-x}$ crystal 2000. Comparing FIGS. 15 and 16 with each other clearly indicates that no dislocations are in the annealed $Si_xGe_{1-x}$ crystal 962.

Exemplary Embodiment 5

The semiconductor wafer 510 was produced as in Exemplary Embodiment 4. As the electronic element 580, a HBT whose active layer was formed using the GaAs layer was formed. Furthermore, interconnections to be connected to the collector, base, and emitter of the HBT were formed. As a result, the electronic device 500 was obtained.

FIG. 17 shows how the collector current of the HBT fabricated as described above varies depending on the collector voltage of the HBT. FIG. 17 shows four different data sequences obtained by setting the base voltage at various values. FIG. 17 indicates that the collector current remained stable within a broad range of the collector voltage. In other words, the fabricated HBT had superior I-V characteristics.

Although some aspects or the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

DESCRIPTION OF REFERENCE NUMERALS 10 electromagnetic wave, 12 electromagnetic wave, 14 electromagnetic wave, 30 electromagnetic wave, 110 semiconductor wafer, 120 base wafer, 122 first main plane, 124 second main plane, 130 portion to be thermally processed, 150 absorptive layer, 160 portion to be heated, 210 semiconductor wafer, 250 absorptive layer, 256 opening, 310 semiconductor wafer, 320 base wafer, 322 first main plane, 324 second main plane, 330 portion to be thermally processed, 340 impurity-diffused region, 410 semiconductor wafer, 420 base wafer, 422 first main plane, 424 second main plane, 426 protective layer, 428 opening, 430 region, 450 absorptive layer, 500 electronic device, 510 semiconductor wafer, 520 base wafer, 522 first main plane, 524 second main plane, 554 inhibition layer, 556 opening, 562 $Si_xGe_{1-x}$ crystal, 566 group ill-V compound semiconductor, 570 electronic element, 571 well, 572 source region, 574 drain region, 576 gate electrode, 578 gate insulator, 580 electronic element, 587 input/output electrode, 588 input/output electrode, 589 gate electrode, 592 interconnection, 593 opening, 594 interconnection, 595 opening, 596 interconnection, 910 semiconductor wafer, 950 absorptive layer, 962 $Si_xGe_{1-x}$ crystal, 1200 thermal process apparatus, 1210 thermal process furnace, 1212 wafer loading opening, 1214 gas inlet, 1216 gas outlet, 1222 flap, 1224 support, 1230 lamp unit, 1232 lamp, 1234 reflector, 1236 filter, 1238 power supply, 1240 lamp unit, 1242 lamp, 1244 reflector, 1248 power supply, 1252 radiation thermometer, 1260 controller, 1280 base wafer, 1282 first main plane, 1284 second main plane, 1290 source gas, 1310 semiconductor wafer, 1350 absorptive layer, 1354 inhibition layer, 1356 opening, 1366 group III-V compound semiconductor, 1390 source gas, 1450 protective layer, 1452 block layer, 1490 source gas, 2000 $Si_xGe_{1-x}$ crystal

The invention claimed is:

1. A method of producing a semiconductor wafer by thermally processing a base wafer having a portion to be thermally processed that is to be thermally processed, the method comprising:
    forming an inhibition layer on the base wafer;
    forming an opening in a region of the inhibition layer;
    providing, within the inhibition layer opening, a portion to be heated that generates heat through absorption of an electromagnetic wave and selectively heats the portion to be thermally processed;
    forming an electronic element in the base wafer
    applying an electromagnetic wave to the base wafer; and
    lowering the lattice defect density of the portion to be thermally processed, by means of the heat generated by the portion to be heated through the absorption of the electromagnetic wave, wherein
    the providing the portion to be heated on the base wafer includes providing the portion to be heated having an absorptive layer such that a ratio of the amount of heat to be generated to the amount of energy of the electromagnetic wave to be applied is higher than the ratio of the amount of the heat to be generated to the amount of the energy of the electromagnetic wave when the electromagnetic wave is applied to the portion to be thermally processed, the absorptive layer having been provided above the portion to be thermally processed, wherein
    an upper temperature limit of the electronic element is lower than the temperature at which the portion to be thermally processed is annealed.

2. The method as set forth in claim 1 of producing a semiconductor wafer, wherein
    in the lowering of the lattice defect density of the portion to be thermally processed is lowered by means of the heat generated by the absorptive layer through the absorption of the electromagnetic wave.

3. The method as set forth in claim 2 of producing a semiconductor wafer, wherein
    the ratio of the amount of the heat to be generated to the amount of the energy of the electromagnetic wave in the absorptive layer is higher than the ratio of the amount of the heat to be generated to the amount of the energy of the electromagnetic wave when the electromagnetic wave is applied to at least a part of the electronic element.

4. The method as set forth in claim 3 of producing a semiconductor wafer, wherein
    the absorption coefficient of the absorptive layer for the electromagnetic wave is higher than the absorption coefficient in at least a part of the electronic element.

5. The method as set forth in claim 3 of producing a semiconductor wafer, further comprising forming, above the electronic element, a protective layer protecting the electronic element from the electromagnetic wave.

6. The method as set forth in claim 3 of producing a semiconductor wafer, further comprising:
    forming, above the electronic element, an inhibition layer inhibiting a precursor of the portion to be thermally processed from growing into a crystal on the base wafer;
    forming, in the inhibition layer, an opening that penetrates the inhibition layer to the base wafer;
    forming, as the portion to be thermally processed, a seed crystal within the opening;
    forming the absorptive layer for heating the seed crystal; and
    annealing the seed crystal by applying the electromagnetic wave, wherein
    the inhibition layer protects the electronic element from the electromagnetic wave.

7. The method as set forth in claim 6 of producing a semiconductor wafer, further comprising forming, after the annealing, by crystal growth, a compound semiconductor that has a lattice match or a pseudo lattice match with the seed crystal.

8. The method as set forth in claim 7 of producing a semiconductor wafer, wherein
    the seed crystal is a $Si_xGe_{1-x}$ crystal (0≤x<1), and the compound semiconductor is a group III-V compound semiconductor.

9. The method as set forth in claim 6 of producing a semiconductor wafer, wherein
    at least a part of the inhibition layer is positioned between the absorptive layer and the seed crystal.

10. The method as set forth in claim 1 of producing a semiconductor wafer, wherein
    the base wafer is an SOI wafer or a Si wafer, and
    the absorption coefficient of the portion to be thermally processed for the electromagnetic wave is higher than the absorption coefficient of Si included in the base wafer for the electromagnetic wave.

11. The method as set forth in claim 1 of producing a semiconductor wafer, wherein
    in the applying of an electromagnetic wave to the base wafer is applied to the base wafer the electromagnetic wave such that the absorption coefficient in the portion to be thermally processed is higher than the absorption coefficient in a region on an electronic device manufactured by dicing the base wafer, the region being other than the portion to be thermally processed.

12. The method as set forth in claim 1 of producing a semiconductor wafer, further comprising growing a precursor of a $Si_xGe_{1-x}$ crystal (0≤x<1) as the portion to be thermally processed into a crystal on the base wafer.

13. The method as set forth in claim 12 of producing a semiconductor wafer, wherein
    in the lowering of the lattice defect density, the lattice defect density in the $Si_xGe_{1-x}$ crystal (0≤x<1) is lowered to 105 cm-2 or lower.

14. The method as set forth in claim 12 of producing a semiconductor wafer, further comprising forming, after the lowering of the lattice defect density, by crystal growth, a group III-V compound semiconductor that has a lattice match or a pseudo lattice match with the $Si_xGe_{1-x}$ crystal (0≤x<1).

15. The method as set forth in claim 14 of producing a semiconductor wafer, wherein
in the forming of a group III-V compound semiconductor by crystal growth, the electromagnetic wave is applied again to the base wafer by using the light source that applied the electromagnetic wave in the lowering of the lattice defect density.

16. The method as set forth in claim 14 of producing a semiconductor wafer, comprising lowering the lattice defect density without exposing the base wafer to air after the growing of the precursor of a $Si_xGe_{1-x}$ crystal into a crystal.

17. The method as set forth in claim 16 of producing a semiconductor wafer, wherein
the growing a precursor of a SixGe1-x crystal into a crystal is performed in a same reaction chamber as the step of lowering of the lattice defect density.

18. The method as set forth in claim 1 of producing a semiconductor wafer, wherein
in the lowering of the lattice defect density, the electromagnetic wave is uniformly applied to the entire base wafer.

19. The method as set forth in claim 18 of producing a semiconductor wafer, wherein
in the lowering of the lattice defect density, the electromagnetic wave that has been pulsed is applied to the base wafer multiple times.

20. The method as set forth in claim 1 of producing a semiconductor wafer, wherein
the electromagnetic wave is applied from a side of the main plane of the base wafer while heating is performed from a side of the back plane being opposite to the main plane of the base wafer in which the portion to be thermally processed has been provided.

21. The method as set forth in claim 1 of producing a semiconductor wafer, wherein
the absorptive layer is positioned closer to the portion to be thermally processed than to the first electronic element.

* * * * *